US007837369B2

(12) United States Patent
Sakurai

(10) Patent No.: US 7,837,369 B2
(45) Date of Patent: Nov. 23, 2010

(54) LIGHT-EMITTING DEVICE, IMAGE-PRINTING DEVICE, AND MANUFACTURING METHOD OF SEALING MEMBER

(75) Inventor: Kazunori Sakurai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 301 days.

(21) Appl. No.: 11/954,493

(22) Filed: Dec. 12, 2007

(65) Prior Publication Data

US 2008/0175605 A1 Jul. 24, 2008

(30) Foreign Application Priority Data

Jan. 22, 2007 (JP) ............................ 2007-011096
Jan. 22, 2007 (JP) ............................ 2007-011097

(51) Int. Cl.
*F21V 7/04* (2006.01)
*H01L 33/00* (2010.01)

(52) U.S. Cl. ....................... 362/555; 362/219; 362/223; 362/237; 355/78

(58) Field of Classification Search ................. 362/555, 362/219, 223, 237
See application file for complete search history.

(56) References Cited

U.S. PATENT DOCUMENTS 6,345,903 B1 * 2/2002 Koike et al. ................. 362/241
2005/0196720 A1 * 9/2005 Ostler et al. .................. 433/29
2006/0050134 A1 * 3/2006 Kobayashi .................. 347/130

FOREIGN PATENT DOCUMENTS

| | | |
|---|---|---|
| JP | A 2000-158705 | 6/2000 |
| JP | A-2004-058448 | 2/2004 |
| JP | A 2004-195676 | 7/2004 |
| JP | A 2004-195677 | 7/2004 |
| JP | A 2004-291435 | 10/2004 |
| JP | A-2005-183353 | 7/2005 |
| JP | A-2006-106229 | 4/2006 |
| JP | A 2006-110729 | 4/2006 |
| JP | A 2006-159492 | 6/2006 |
| JP | A 2006-192682 | 7/2006 |
| JP | A-2006-281746 | 10/2006 |

* cited by examiner

*Primary Examiner*—Sandra L O'Shea
*Assistant Examiner*—William J Carter
(74) *Attorney, Agent, or Firm*—Oliff & Berridge, PLC

(57) ABSTRACT

A light-emitting device includes a plurality of light-emitting elements, an element substrate on which the plurality of light-emitting elements are disposed, a plate-shaped sealing member having a lens array in which a plurality of lenses is arranged and sealing the plurality of light-emitting elements together with the element substrate, and a spacer disposed between the element substrate and the plate-shaped sealing member for maintaining a distance between the light-emitting elements and the lenses, in which the spacer is provided with a plurality of sealing cavities, at least one lens of the plurality of lenses is disposed so as to overlap each of the sealing cavities, and the light-emitting elements are disposed in each of the sealing cavities so as to overlap the corresponding lenses.

5 Claims, 12 Drawing Sheets

LIGHT-EMITTING DEVICE, IMAGE-PRINTING DEVICE, AND MANUFACTURING METHOD OF SEALING MEMBER

BACKGROUND

1. Technical Field

The present invention relates to a light-emitting device, an image printing apparatus, and a manufacturing method of a sealing member.

2. Related Art

There are known exposure devices which are used as line-type optical heads of electro-photographic image printing apparatuses and which produce an electrostatic latent image on an image carrier (for example, photo-sensitive drum). JP-A-2004-195676 and JP-A-2004-195677 disclose exposure devices having a structure in which a light-emitting plate, on which a plurality of organic electro luminescent elements (organic light-emitting diodes (OLED)) are arranged, and a lens array, in which a plurality of lenses is arranged, are combined with each other. In the exposure device having such a structure, a plurality of ball lenses having a substantial spherical shape overlaps a plurality of organic electro luminescent (EL) elements, respectively, and light beams emitted from the corresponding organic EL elements are converged by the ball lenses. The converged light reaches an image carrier and thus an electrostatic latent image corresponding to the light is formed.

In FIG. 5 of JP-A-2000-158705, a different type of lens array is disclosed. In this lens array, plane-convex lenses are formed on both surfaces of a transparent plate member, and the plane-convex lenses on the front surface and the plane-convex lenses on the back surface form biconvex lenses. A plurality of biconvex lenses is disposed to overlap a plurality of organic EL elements, respectively, and light beams emitted from the corresponding organic EL elements are converged by the biconvex lenses. The converged light reaches an image carrier and forms an electrostatic latent image.

In order to sufficiently enhance performance of an exposure device employing the light-emitting device and the lens array, a large amount of light emitted from the organic EL elements must be introduced into the lenses disposed in a manner of overlapping the corresponding organic EL elements so that light use efficiency must be high. Accordingly, a distance between the organic EL elements and the lenses must be sufficiently small.

The light-emitting device used as the exposure device of the electro-photographic image printing apparatus is not a bottom emission type image printing apparatus in which light emitted from a light source emerges from the element substrate side, but a top emission type image printing apparatus in which light emerges from the opposite side of the element substrate. In the top emission type light-emitting device, light emitted from the organic EL elements emerges from the sealing layer side in which the sealing layer covers the organic EL elements in order to protect the organic EL elements from external air. It is preferable that the sealing layer is thick from the standpoint of improving reliability of the exposure device (for example, prolong lifespan of the organic EL elements). However, if the sealing layer is sufficiently thick, a distance between the lens array and the organic EL element array becomes undesirably larger. Accordingly, according to the known arts, the decrease of the distance between the lens array and the organic EL element array and the increase of reliability were in the tread-off relationship.

SUMMARY

An advantage of some aspects of the invention is that it provides a light-emitting device which is capable of sufficiently decreasing a distance between a lens array and a light-emitting element and satisfactorily increasing reliability while employing the lens array, an image printing apparatus including the light-emitting device, and a manufacturing method of a sealing member of the light-emitting device.

According to one aspect of the invention, there is provided a light-emitting device including a plurality of light-emitting elements, an element substrate on which the plurality of light-emitting elements is arranged, a lens array in which a plurality of lenses is arranged, a sealing member having a plate shape, which seals the plurality of light-emitting elements together with the element substrate, and a spacer disposed between the element substrate and the sealing member for maintaining a distance between the light-emitting elements and the lenses, in which the spacer is provided with a plurality of sealing cavities, at least one of the plurality of lenses is disposed so as to overlap each of the sealing cavities, and the light-emitting elements are disposed in each of the sealing cavities so as to overlap the at least one lens.

In the specification, the term "light-emitting element" means an element which changes light-emitting characteristic in response to electric energy, i.e. includes organic EL elements, inorganic EL elements, and LED elements as examples. Further, the term "sealing" relating to the light-emitting element means an action or a structure of protecting the light-emitting element from external air by surrounding it.

Thanks to the structure in which the lens array is directly provided to the sealing member, it is possible to increase reliability of the light-emitting device by increasing the thickness of the sealing member while minimizing the distance between the lens and the light-emitting elements. Further, it is possible to decrease the number of parts of the light-emitting device because the sealing member and the lens array are not separately provided, and also to decrease the number of processes of a manufacturing method of the light-emitting device because there is no need to separately fix the sealing member and the lens array to the element substrate.

In the light-emitting device, it is preferable that the light-emitting elements are disposed in each of the plurality of sealing cavities provided to the spacer so as to overlap the at least one lens. In the case in which all of the light-emitting elements are disposed in a single shared sealing cavity, the light-emitting elements disposed near the edge of the sealing cavity deteriorate earlier than the light-emitting elements disposed at a center portion of the sealing cavity, and thus the lifespan of the light-emitting elements in the sealing cavity is not uniform. However, according to the invention, since the sealing cavities are disposed so as to correspond to groups of light-emitting elements, respectively, each group including a small number of light-emitting elements, the lifespan of the light-emitting elements is uniform. In the case in which all of the light-emitting elements are disposed in a single shared sealing cavity, there is the likelihood that the light emitted from the light-emitting elements enters the lenses which do not overlap the corresponding light-emitting elements. However, according to the invention, since the sealing cavities are disposed so as to correspond to the groups of light-emitting elements, each group including a small number of light-emitting elements, it is possible to suppress the likelihood. Further, since the spacer is provided with the plurality of sealing cavities, the spacer is also provided with barrier ribs. Accordingly, the spacer, an element of the light-emitting device, is reinforced thanks to the barrier ribs, and thus it is possible to suppress bending of the light-emitting device even in the case in which the light-emitting device is sufficiently long.

In the light-emitting device, the inside of the sealing cavity may be filled with inert gas such as nitrogen, helium, argon, and xenon. Accordingly, it is possible to suppress deterioration of the light-emitting elements by the inert gas.

In the light-emitting device, it is preferable that an absorbent is disposed in the sealing cavities for absorbing at least either one of moisture and oxygen. Thus, it is possible to suppress deterioration of the light-emitting elements by the presence of the absorbent.

In the light-emitting device, it is preferable that the sealing member is provided with concave portions in which the absorbent is disposed. Thus, it becomes easy to install the absorbent thanks to the presence of the concave portions. That is, the concave portions serve as landmarks for installing the absorbent. In the case in which the absorbent is in gel state, it is easy to uniformly distribute the absorbent over a desired area and decrease the likelihood that the absorbent in gel state flows and is attached to the lenses by the presence of the concave portions.

In the light-emitting device, it is preferable that the spacer is convex wails integrated with the sealing member. Here, the term "integrated" means a structure in which two objects (spacer and sealing member) are made of the same material or a structure in which the spacer and the sealing member are made of different materials but they are fixed to each other so that they are not separated from each other as long as they break by external force. If the spacer is integrated with the sealing member, it is easy to attach the spacer and the sealing member to the element substrate.

The convex walls are formed in a tapered form in a manner such that it becomes narrower as it becomes farther from the sealing member. Most of light emitted from the light-emitting elements enters the lenses passing through the sealing cavities surrounded by the convex walls, but some of the light advances toward the convex walls. It the light reflected from the convex walls enters the lenses, an image of the light emerging from the lenses is disturbed. By forming the convex walls in a tapered form, it is possible to decrease the likelihood that the light reflected from the convex walls enters the lenses.

According to another aspect of the invention, there is provided a light-emitting device including an element substrate on which a plurality of light-emitting elements is arranged and a plate-shaped sealing member having a lens array, in which a plurality of lenses is arranged, and sealing the plurality of light-emitting elements together with the element substrate, in which the sealing member and the element substrate define sealing cavities in which the light-emitting elements are disposed, the sealing member is provided with concave portions in which an absorbent absorbing at least one of moisture and oxygen is disposed, and the concave portions communicate with the concave portions.

In the light-emitting device, since the lens array is directly provided to the sealing member, it is possible to increase reliability of the light-emitting device by increasing the thickness of the sealing member while decreasing a distance between the lens and the light-emitting element. Further, since there is no need to separately provide the sealing member and the lens array, the number of parts is decreased. Still further, since there is no need to separately fix the sealing member and the lens array to the element substrate, it is possible to decrease the number of processes of a manufacturing method of the light-emitting device.

The sealing member is provided with concave portions for installing an absorbent which absorbs at least either one of moisture and oxygen, and the concave portions communicate with the sealing cavities. Thus, it is possible to suppress deterioration of the light-emitting elements by the presence of the absorbent. That is, it becomes easy to install the absorbent due to the concave portions. For example, the concave portions are landmarks for installing the absorbent. In the case of using the absorbent in gel state (in semifluid state), it is easy to uniformly distribute the absorbent in gel state over a desired area, and it is possible to decrease the likelihood that the absorbent in gel state flows and thus is attached to the lens portions.

The inside of the sealing cavities is filled with inert gas such as nitrogen, helium, argon, and xenon. That is, it is possible to suppress deterioration of the light-emitting elements by the inert gas.

According to further aspect of the invention, there is provided an image printing apparatus including an image carrier, a charger charging the image carrier, the light-emitting device forming a latent image by irradiating light emitted from the plurality of light-emitting elements on the charged surface of the image carrier, a developer forming a visible image on the image carrier by attaching toner to the latent image, and a transcriber transferring the visible image on the image carrier from the image carrier to an object.

According to a still further aspect of the invention, there is provided a manufacturing method of a sealing member provided with concave portions, in which an absorbent is disposed, and lenses, the manufacturing method including filling lens-shaped grooves and ditches of a mold provided with the lens-shaped grooves for forming lenses and the ditches for forming protrusions defining the concave portions with resin, bringing the mold into tight contact with the plate member so that at least one surface of the plate member which is transparent comes into contact with the resin, curing the resin after the brining, and separating the mold from the plate member after the curing. According to the method, it is possible to simultaneously form the lenses and the protrusions defining the concave portions on the surface of the plate member.

In the manufacturing method of a sealing member provided with the concave portions, the lenses, and convex walls, the mold is provided with convex wall-shaped grooves for forming the convex walls integrated with the sealing member, which become the spacer maintaining a distance between the light-emitting elements and the lenses. In the filling, the lens-shaped grooves, the convex walls-shaped grooves, and the ditches are filled with the resin. In the bringing the mold into tight contact with the plate member, the resin filling the lens-shaped grooves, the convex wall-shaped grooves, and the ditches comes into contact with at least the surface of the plate member which is transparent. According to this method, the lenses, the convex walls, and the protrusions defining the concave portions are simultaneously formed on the surface of the sealing member, i.e. the plate member.

BRIEF DESCRIPTION OF THE DRAWINGS

The invention will be described with reference to the accompanying drawings, wherein scales of elements are different from real scales but adequately modified scales.

DESCRIPTION OF EXEMPLARY EMBODIMENTS

First Embodiment

Figure 1:
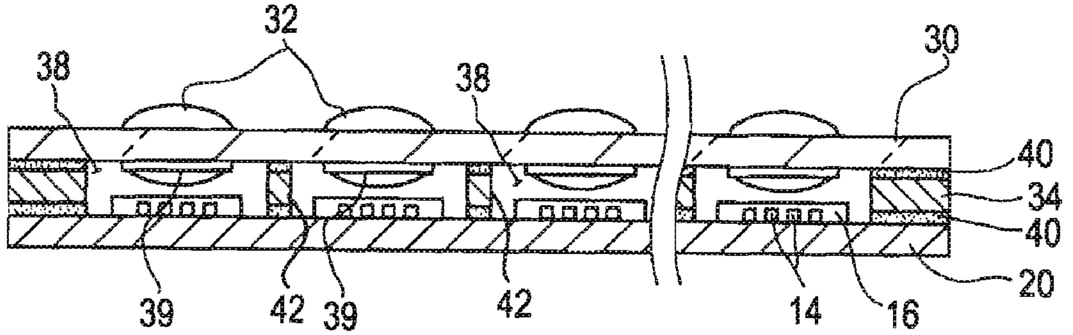
FIG. 1 is a front-side sectional view illustrating a light-emitting device according to a first embodiment of the invention.
Figure 2:
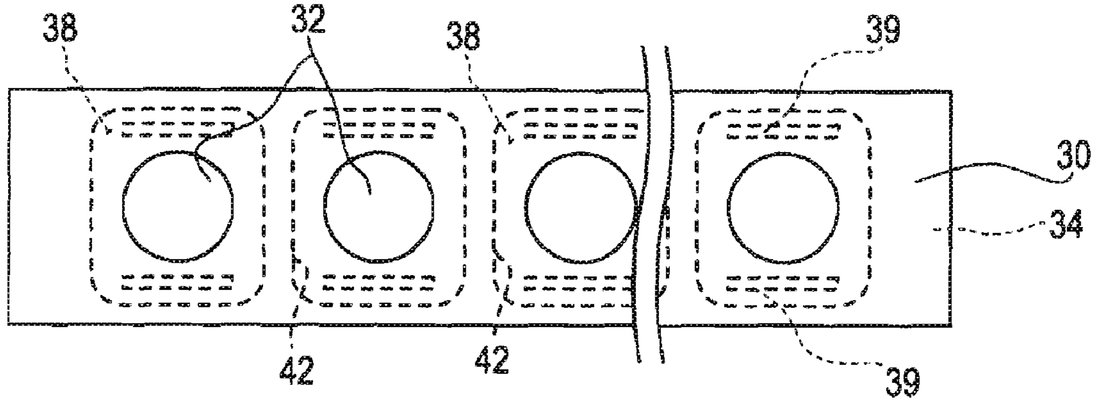
FIG. 2 is a plan view illustrating the light-emitting device shown in FIG. 1.

FIG. 1 shows a light-emitting device according to a first embodiment and FIG. 2 is a plan view corresponding to FIG. 1. The light-emitting device is used as a line-type head, i.e. an exposure device, which produces a latent image by irradiating light on a surface of an image carrier (for example, photosensitive drum) in an electro-photographic image printing apparatus.

The light-emitting device includes an element substrate 20 which has a plate shape and is made of a proper material such as glass, resin, ceramic, and metal. A plurality of light-emitting elements 14 is arranged on the element substrate 20. According to this embodiment, the light-emitting elements 14 are organic EL elements performing surface emission. Accordingly, each of the light-emitting elements 14 includes a light-emitting layer which is made of an organic material and which emits light in response to current, and electrodes (a negative electrode and a positive electrode) having the light-emitting layer therebetween for flowing current through the light-emitting layer. In addition to the light-emitting layer, a variety kinds of layers which transports or injects holes and electrons to and into the light-emitting layer may be disposed between the positive electrode and the negative electrode.

The light-emitting panel having the element substrate 20 and the light-emitting elements 14 is the top emission type light-emitting panel and thus light emitted from the light-emitting elements 14 advances toward the upper side of FIG. 1, which is the opposite side of the light-emitting substrate 20. A transparent insulation member, i.e. a passivation layer (protective film 16) made of, for example, silicon dioxide or silicon nitride is formed su surround the light-emitting elements 14. The protective film 16 prevents the organic material of the light-emitting elements 14 from deteriorating due to oxygen or moisture.

A plate-shaped sealing member 30 is disposed so as to overlap the element substrate 20. The sealing member 30 seals the plurality of light-emitting elements 14 together the element substrate 20. The sealing member 30 has a lens array in which a plurality of lenses 32 is arranged. In other words, the sealing member 30 is the lens array. The lens array 32 refracts the light emitted from the light-emitting elements 14 and allows the refracted light to pass therethrough.

As shown in FIGS. 1 and 2, biconvex lenses are formed on the sealing member 30 but plane-convex lenses or other different lenses may be formed on the sealing member 30. The sealing member 30 is made of a material having high transmittance and good gas barrier properties. An example of the material is glass. The lenses may be formed on both surfaces or one surface of a plate-shaped sealing member which is made of glass by transparent resin.

The sealing member 30 may undergo antireflection treatment. The antireflection treatment may be performed with respect to the outer surfaces of the lenses on the lower side of FIG. 1, but may be performed with respect to the opposite surfaces of the lenses on the upper side of FIG. 1. Thanks to the antireflection treatment, it is possible to decrease the likelihood that light is reflected from the lower side of FIG. 1, the light reflected from the element substrate 20 enters the lenses, and the reflected light disturbs an image.

A spacer 34 maintaining a distance between the light-emitting elements 14 and the lenses 32 is disposed between the element substrate 20 and the sealing member 30. According to this embodiment, the spacer 34 is a different member from the sealing member 30, and is bonded to the element substrate 20 and the sealing member 30 by an adhesive 40. It is preferable that the adhesive 40 is made of a material having good gas barrier properties, for example epoxy-based adhesive.

Figure 3:
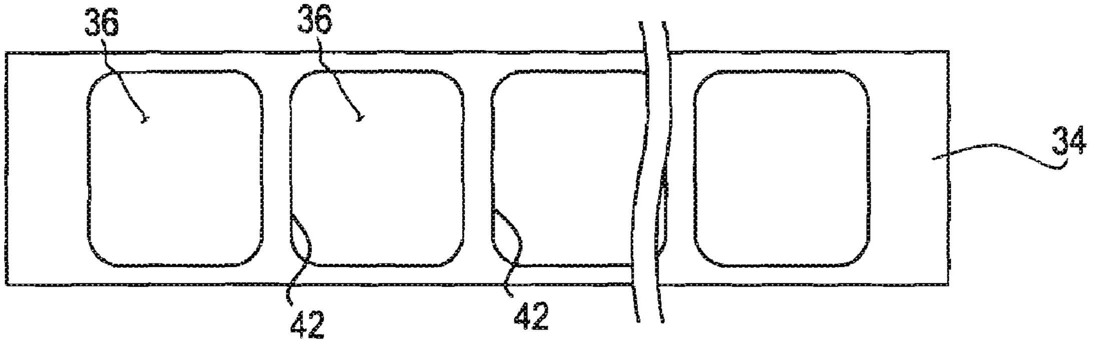
FIG. 3 is a plan view illustrating a spacer used in the light-emitting device according to the first embodiment of the invention.

FIG. 3 is a plan view illustrating the spacer 34. The spacer 34 is a flat plate provided with a plurality of through-holes 36. In the case in which the light-emitting device is constructed by combining the element substrate 20, the sealing member 30, and the spacer 34, the through-holes 36 function as sealing cavities 38 and sealed up by the element substrate 20, the sealing member 30, and the spacer 34. That is, the plurality of sealing cavities 38 is defined by the element substrate 20, the sealing member 30, and the spacer 34. Portions of the spacer 34 which are used to partition neighboring through-holes 36 are shown like barrier walls 42 in FIG. 1.

It is preferable that the inside circumferential surface of each of the through-holes 36 of the spacer 34 undergoes light absorption treatment. For example, it is preferable that a material having black color such as black resin containing titanium, titanium alloy, or both of titanium and titanium alloy is coated on the inside circumferential surface. Alternatively, the entire spacer 34 may be made of black resin.

In the sealing cavities 38, the lenses 32 are disposed so as to overlap the sealing cavities 38, respectively. The light-emitting elements 14 are disposed in the sealing cavities 38 so as to overlap the lenses 32. An absorbent 39 absorbing at least either one of moisture and oxygen is disposed in each of the sealing cavities 38. The use of the absorbent 39 can suppress deterioration of the light-emitting elements 14. Further, each of the sealing cavities 38 may be filled with inert gas such as nitrogen, helium, argon, or xenon. That is, the inert gas can suppress deterioration of the light-emitting elements 14.

Each of the lenses 32 of the sealing member 30 allows the light emitted from the plurality of light-emitting elements 14 disposed to overlap the corresponding lens 32 (i.e. the plurality of light-emitting elements 14 disposed in one sealing cavity 38 so as to overlap one lens 32) to pass therethrough. An image of light emerging from the lens 32 is an inverted image (point symmetric image) of an image of light entering the lens 32. Accordingly, in this embodiment, a signal of the inverted image is allocated to the plurality of light-emitting elements 14 corresponding to one lens 32 and then the image emerging from the lens 32 becomes finally an upright image. In this manner, the light emerging from all the lenses 32 forms an upright image as a whole.

In the light-emitting device according to this embodiment, since the sealing member 30 has the lens array, it is possible to enhance the reliability of the light-emitting device by the increased thickness of the sealing member 30 while suppressing the distance between the lens 32 and the light-emitting element 14 to the minimum. Further, since there is no need to separately install the sealing member 30 and the lens array, it is possible to reduce the number of parts of the light-emitting device. Further, there is no need to separately fix the sealing member 30 and the lens array to the element substrate 20, it is possible to reduce the number of processes of the manufacturing method of the light-emitting device.

In each of the plurality of sealing cavities 38 provided to the spacer 34, the light-emitting elements 14 are disposed so as to overlap the corresponding one lens 32. In the case in which all of the light-emitting elements 14 is disposed in a shared single sealing cavity, the light-emitting elements disposed at the edge of the sealing cavity deteriorate more earlier than the light-emitting elements disposed at a center portion and thus the lifespan of the light-emitting elements is not uniform. However, according to the invention, since a small number of light-emitting elements 14 is disposed in each sealing cavity 38, the lifespan of the light-emitting elements 14 is uniform. Further, in the case in which all of the light-emitting elements are disposed in the single shared sealing cavity, there is the likelihood that the light emitted from the corresponding light-emitting elements enters the lenses which do not correspond to the light-emitting element. However, according to the invention, since the light-emitting elements 14 are groused and only one group including a small number of light-emitting elements 14 is disposed in each sealing cavity 14, it is possible to suppress occurrence of such events. Further, the spacer 34 is provided with the plurality of sealing cavities 38 and thus the spacer 34 is provided with barrier ribs 42. Accordingly, the spacer 34, part of the light-emitting device, is reinforced by the barrier ribs 42, and thus it is possible to suppress bending of the light-emitting device even in the case in which the light-emitting device is long enough.

It is preferable that each of the sealing cavities 38 is provided with an absorbent absorbing at least either one of moisture and oxygen. Thanks to the structure, it is possible to suppress deterioration of the light-emitting elements 14.

Figure 4:
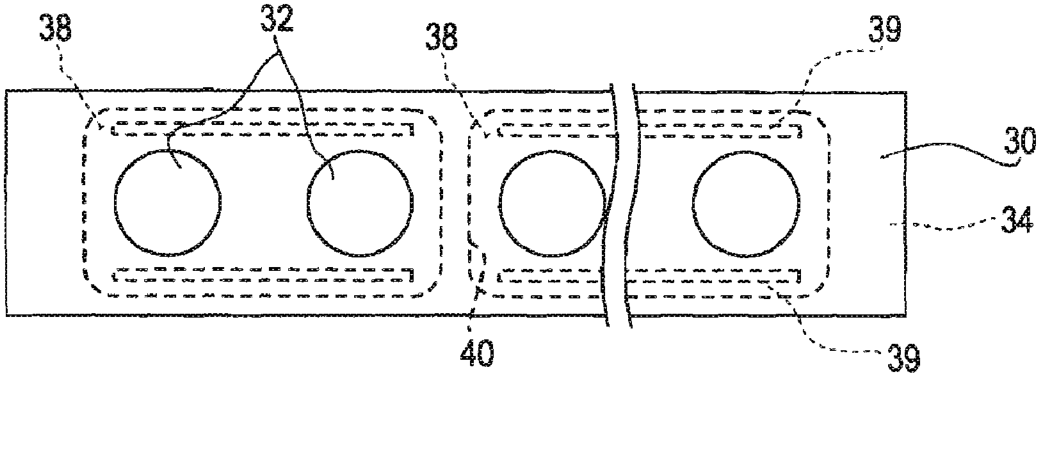
FIG. 4 is a plan view illustrating a light-emitting device according to a first modification of the first embodiment.

FIG. 4 shows a light-emitting device according to one modification of the first embodiment. In FIG. 4, like elements as in the first embodiment are represented by like reference symbols. In the light-emitting device according to this modification, each of a plurality of sealing cavities 38 provided to a spacer 34 overlaps two lenses 32, and light-emitting elements disposed in each of the sealing cavities 38 also overlap the two lenses 32. In this manner, two or more lenses may overlap each sealing cavity. In this modification, the light-emitting elements 14 are divided into a plurality of groups, each group having a small number of light-emitting elements 14. Further, since only a smaller number of light-emitting elements is disposed so as to correspond to one sealing cavity 38, the lifespan of the light-emitting elements 14 is relatively uniform as compared to the case in which all of the light-emitting elements 14 are disposed in one sealing cavity 38. Since each sealing cavity 38 is disposed so as to correspond to a small number of light-emitting devices 14, it is possible to suppress the likelihood that the light emitted from the light-emitting elements enters the lens which does not overlap the corresponding light-emitting devices. Further, since the spacer 34, part of the light-emitting device, is reinforced by the barrier ribs 42, t is possible to suppress bending of the light-emitting device even in the case in which the light-emitting is long enough.

Figure 5:
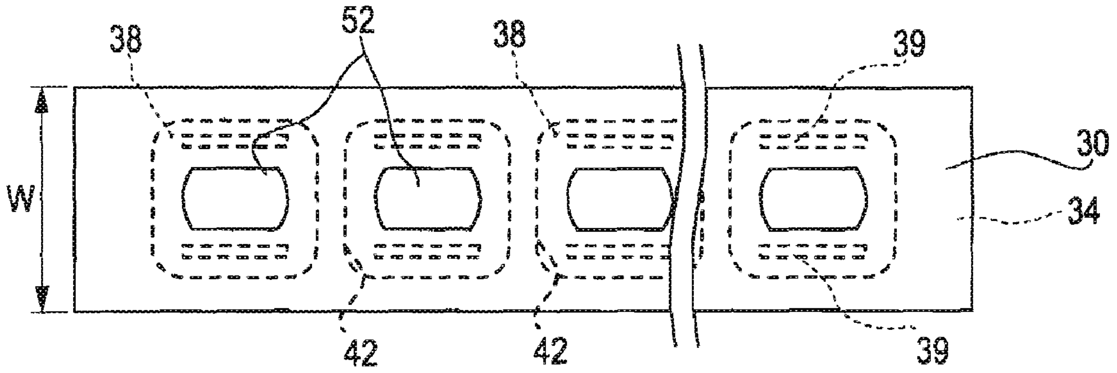
FIG. 5 is a plan view illustrating a light-emitting device according to a second modification of the first embodiment.

FIG. 5 shows a light-emitting device according to another modification of the first embodiment. In FIG. 5, like elements as in the first embodiment are represented by like reference symbols. In the light-emitting device according to this modification, the lenses 32 provided to the sealing member 30 are replaced with lenses 52. The lenses 52 have the same curvature as the lenses 32, but the shape of the lenses 52 is different from the shape of the lenses 32. That is, the lenses 32 have a circular shape when they are viewed in an optical axis direction (in a direction perpendicular to the surface of paper in FIG. 2) but the lenses 52 have an oval shape when they are viewed in the optical axis direction (in a direction perpendicular to the surface of paper in FIG. 5). In greater detail, the shape of the lenses 52 is the same as a shape obtained by straightly cutting away the upper end and the lower end of a circle. The use of the lenses 52 can reduce the width of the light-emitting device if the longitudinal direction of the lenses 52 is aligned in parallel with the longitudinal direction of the light-emitting device.

Second Embodiment

Figure 6:
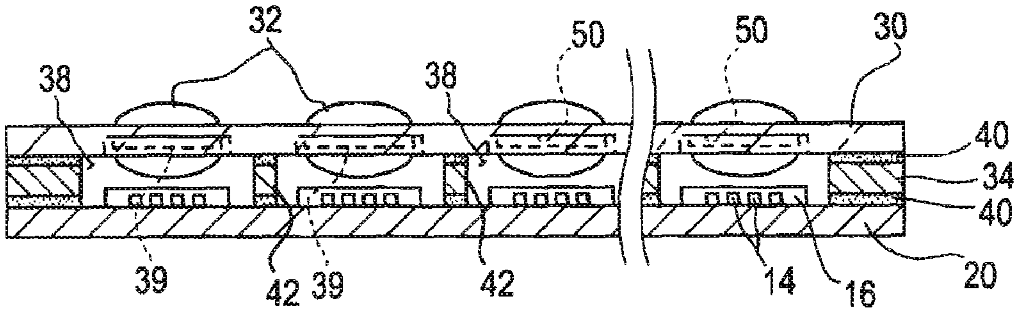
FIG. 6 is a front-side sectional view illustrating a light-emitting device according to a second embodiment of the invention.
Figure 7:
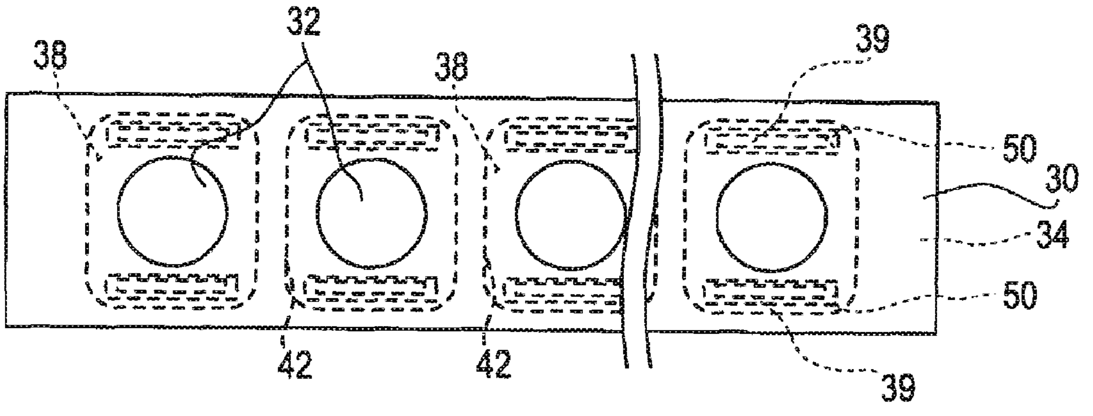
FIG. 7 is a plan view illustrating the light-emitting device shown in FIG. 6.
Figure 8:
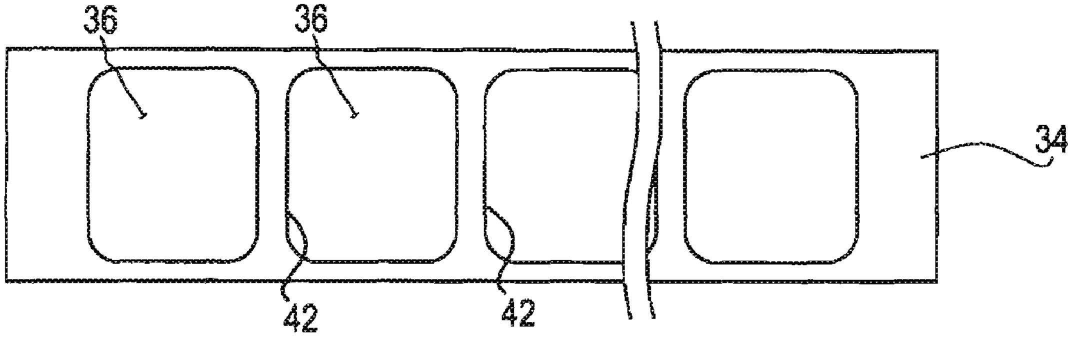
FIG. 8 is a plan view illustrating a spacer used in the light-emitting device according to the second embodiment of the invention.

FIG. 6 is a front-side sectional view illustrating a light-emitting device according to a second embodiment of the invention. FIG. 7 is a plan view corresponding to FIG. 6. FIG. 8 is a plan view illustrating a spacer 34 used in the light-emitting device according to the second embodiment. In FIGS. 6 to 8, like elements as in the first embodiment and the second embodiment are referenced by like reference symbols. In this embodiment, the element substrate 20 and the spacer 34 used in the light-emitting device according to the first embodiment are also used in a light-emitting device according to the second embodiment.

However, a sealing member 30 in this embodiment is generally similar to that in the first embodiment but different from that in the first embodiment from the following point. In this embodiment, the sealing member 30 is provided with concave portions 50, ditches, for receiving an absorbent 39 therein. Thanks to the concave portions 50, it is possible to easily install the absorbent 39. For example, the concave portions 50 become land marks for installing the absorbent 39. In the case of using the absorbent 39 in gel state (semifluid state), it is easy to uniformly distribute the absorbent over the entire area by the presence of the concave portions 50, and it is possible to reduce the likelihood that the absorbent 39 in the gel state flows and is attached to the lens 32 portion.

Figure 9:
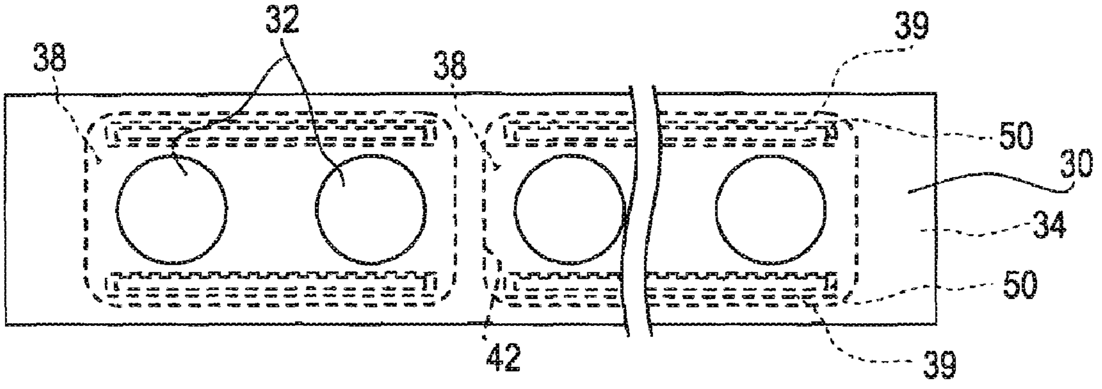
FIG. 9 is a plan view illustrating a light-emitting device according to a first modification of the second embodiment.

FIG. 9 shows a light-emitting device according to a modification of the second embodiment. In FIG. 9, like elements as in the second embodiment are represented by like reference symbols. In the light-emitting device according to this modification, each of a plurality of sealing cavities 38 provided to a spacer 34 overlap two lenses 32. In each of the sealing cavities 38, light-emitting elements 18 are disposed so as to overlap the two lenses 32. In this manner, two or more lenses may overlap each sealing cavity. The lenses 52 shown in FIG. 5 may be applied to the second embodiment.

Figure 10:
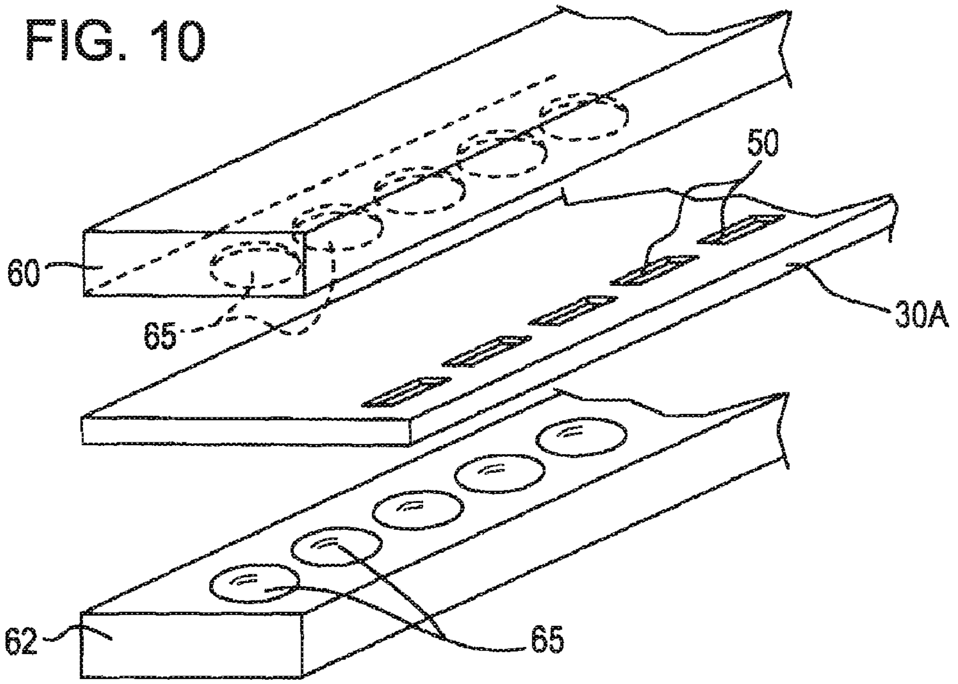
FIG. 10 is a perspective view illustrating a manufacturing method of a sealing member used in the light-emitting devices according to the first and second embodiments.

Manufacturing Method of Sealing Member Used in First Embodiment and Second Embodiment FIG. 10 shows a manufacturing method of a sealing member 30 used in the light-emitting devices according to the first embodiment and the second embodiment. In the manufacturing method, a transparent flat plate member 30A which is a base material of the sealing member 30, a first mold 60, and a second mold 62 are used. It is preferable that the flat plate member 30A is made of glass. In the case of manufacturing the sealing member 30 used in the light-emitting device according to the second embodiment, the flat plate member 30A is preliminarily provided with concave portions 50. Each of the molds 60 and 62 is provided with a plurality of lens-shaped grooves 65 for forming lenses 32.

The lens-shaped grooves 65 of the molds 60 and 62 are filled with transparent resin. It is preferable that the transparent resin is a material having a cured refractive index that is reached after curing is similar to that of the flat plate material 30A. Next, the molds 60 and 62 are brought into tight contact with the flat plate member 30A so that the transparent resin is adhered to both surfaces of the flat plate member 30A. In addition, the transparent resin is cured and then the molds 60 and 62 are separated from the plate member 30A after the transparent resin is cured. If the lenses 32 are plane-convex lenses, only any one of the molds 60 and 62 may be used.

Figure 11:
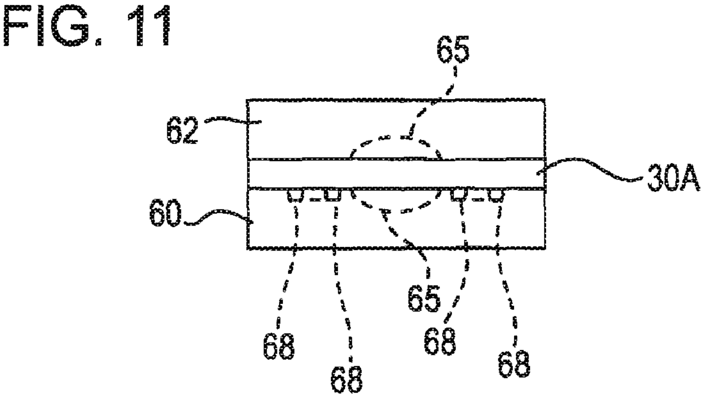
FIG. 11 is a side view illustrating a manufacturing method of a sealing member according to one modification of the manufacturing method shown in FIG. 10.
Figure 12:
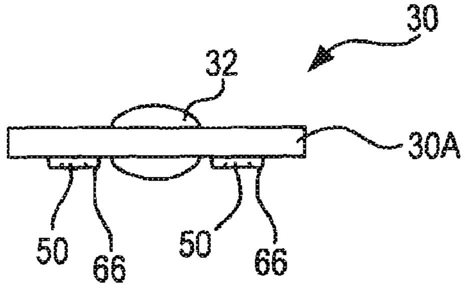
FIG. 12 is a side view illustrating the sealing member manufactured by the manufacturing method shown in FIG. 11.

FIG. 11 shows a modification of the manufacturing method shown in FIG. 10. By this manufacturing method, the sealing member 30 shown in FIG. 12 is formed. As shown in FIG. 12, two protrusions 66 are formed on one surface of a base material 30A of the sealing member 30. Each of the protrusions 66 is provided with concave portions 50 (i.e. ditches) for installing the absorbents 39.

In this manufacturing method, the flat plate member 30A which is a base material of the sealing member 30, the first mold 60, and the second mold 62 are used. It is preferable that the flat plate member 30A is made of glass. Each of the molds 60 and 62 is provided with lens-shaped grooves 65 for forming lenses 32. The first mold 60 is further provided with ditches 68 for forming the protrusions 66 defining the concave portions 50.

The lens-shaped grooves 65 and the ditches 68 of the molds 60 and 62 are filled with resin. It is preferable that resin filling at least the lens-shaped grooves 65 has a cured refractive index similar to that of the flat plate member 30A. Resin filling the ditches 68 may be the same transparent resin filling the lens-shaped grooves 65 or may be another resin, for example black resin.

Next, the molds 60 and 62 are brought into tight contact with the flat plate member 30A so that the resin comes into contact with the both surfaces of the flat plate member BOA. Further, the resin is cured, and then the molds 60 and 62 are separated from the plate member 30A after the curing. If the lenses 32 are plane-convex lenses, only the first mold 60 may be used. According to this manufacturing method, the lenses 32 and the protrusions 66 defining the concave portions 50 are simultaneously formed on one surface of the flat plate member 30A which consequently becomes the sealing member 30.

Third Embodiment

Figure 13:
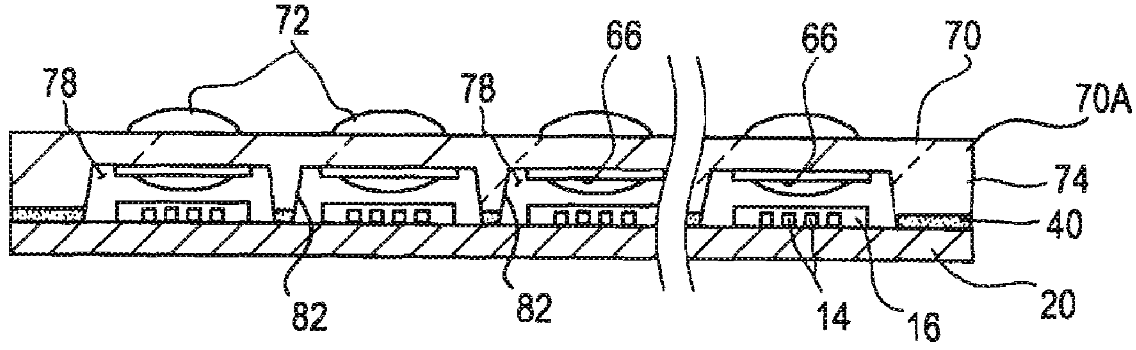
FIG. 13 is a front-side sectional view illustrating a light-emitting device according to a third embodiment of the invention.
Figure 14:
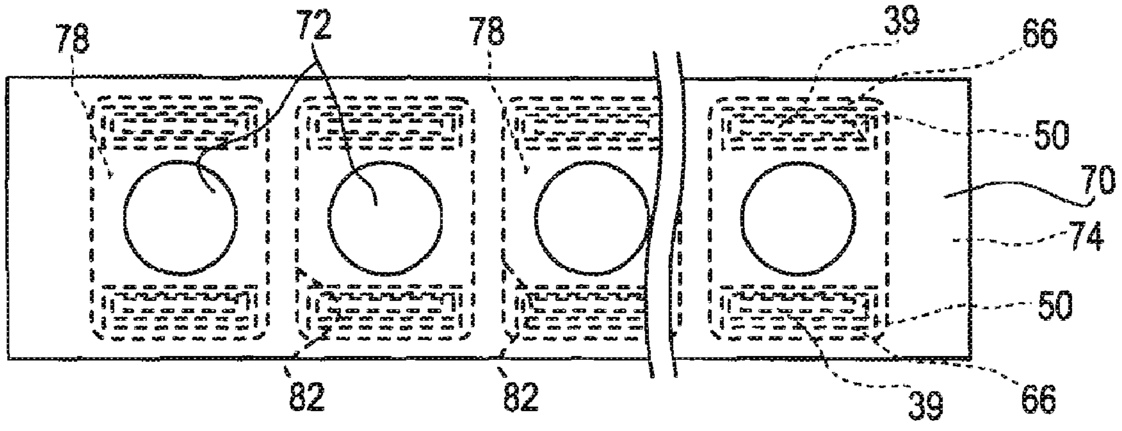
FIG. 14 is a plan view illustrating the light-emitting device shown in FIG. 13.
Figure 15:
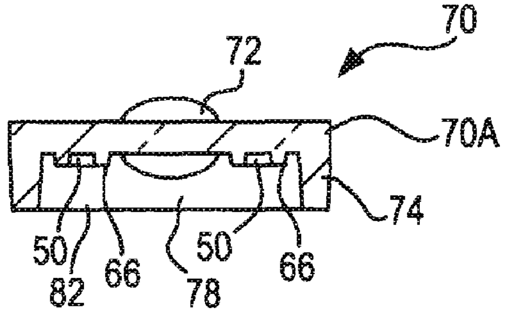
FIG. 15 is a cross-sectional view illustrating light-emitting device shown in FIG. 13.

FIG. 13 is a front-side sectional view illustrating a light-emitting device according to a third embodiment of the invention. FIG. 14 is a plan view corresponding to the view shown in FIG. 13. FIG. 15 is a cross-sectional view corresponding to the view shown in FIG. 13. In FIGS. 13 and 14, like elements as in the first embodiment are represented by like reference symbols. On this embodiment, the same element substrate 20 as in the first embodiment is used.

A sealing member 70 having a plate shape is disposed so as to overlap the element substrate 20. The sealing member 70 seals a plurality of light-emitting elements 14 together with the element substrate 20. The sealing member 70 has a lens array in which a plurality of lenses is arranged. In other words, the sealing member 70 is the lens array.

As shown in FIGS. 13, 14, and 15, plane-convex lenses are formed on the sealing member 70, but the plane-convex lenses may be different lenses which are proper for the use thereof. The sealing member 70 is made of a material having good gas barrier properties and high transmittance. A representative material of the sealing member 70 is glass. Lenses may be formed on both surfaces or one surface of a transparent flat plate member 70A which is a base material of the sealing member made of glass, with transparent resin. As in the first embodiment, the sealing member 70 may undergo antireflection treatment.

A spacer 74 is disposed between the element substrate 20 and the sealing member 70 for maintaining a distance between the light-emitting elements 14 and the lenses 72. In this embodiment, the spacer 74 is convex walls integrated with the transparent flat plate member 70A which is the base material of the sealing member 70. Here, the word "integrated" means both a structure in which the transparent flat plate 70A and the spacer 74 are made of the same material and a structure in which the spacer 74 and the flat plate member 70A are made of different materials but they are fixed to each other so that they cannot be separated from each other as long as they do not break by external force. Since the spacer 74 and the sealing member 70 are integrated into a single body, it is easy to attach the spacer 74 and the sealing member 70 to the element substrate 20.

The spacer 74 is bonded to the element substrate 20 by an adhesive 40. The adhesive 40 is made of a material having good gas barrier properties (for example, epoxy-based adhesive).

The spacer 74 which are convex walls of the sealing member 70 is provided with a plurality of sealing cavities 78. In the case in which the light-emitting device is constructed by combining the element substrate 20 and the sealing member 70, the sealing cavities 78 are sealed up by the element substrate 20 and the sealing member 70. That is, the plurality of sealing cavities 78 is defined by the element substrate 20 and the sealing member 70. Of the spacer 74, portions used to partition neighboring sealing cavities 78 are shown like barrier ribs 82 in the drawings.

It is preferable that at least the inside circumferential surface of the sealing cavities 78 of the spacer 74 undergo light absorption treatment. For example, black material such as black resin containing titanium, titanium alloy, or both titanium and titanium alloy is coated on the inside circumferential surface. Alternatively, in the case in which the spacer 74 and the flat plate member 70A are made of different materials from each other, the spacer 74 may be made of the black resin.

Each of the sealing cavities 78 is disposed so as to overlap one lens 72, and a plurality of light-emitting elements 14 is disposed in each of the sealing cavities 78. An absorbent 39 which can absorb at least either one of moisture and oxygen is disposed in each of the sealing cavities 78. It is possible to suppress deterioration of the light-emitting elements 14 by the presence of the absorbent 39. In the sealing member 70, two protrusions 66 are formed on one surface of the base material 70A of the sealing member 70. The each of the protrusions 66 is provided, with concave portions 50 (i.e. ditches) for mounting the absorbent 39. As described in association with the second embodiment, it is easy to install the absorbent 39 by the presence of the concave portions 50. Further, the sealing cavities 78 are filled with inert gas such as nitrogen, helium, argon, and xenon. It is possible to suppress deterioration of the light-emitting elements 14 by the presence of the inert gas.

Each of lenses 72 of the sealing member 70 allows the light emitted from the plurality of light-emitting elements disposed so as to overlap the corresponding lens 72 (the light emitted from the plurality of light-emitting elements 14 disposed in the sealing cavity 78 overlapping the corresponding lens 72) to pass therethrough. As described above in association with the first embodiment, in this embodiment, a signal of an inverted image is allocated to the plurality of light-emitting elements 14 corresponding to each of the lens 72, and the light emerging from the corresponding lens 72 finally forms an upright image. By this image forming processing, the light emerging from the entire lenses 72 forms an upright image as a whole.

As shown in FIGS. 13 and 15, the spacer 74, the convex walls of the sealing body 70, is tapered in a manner such that it becomes narrower as it becomes farther from the flat plate member 70A. Most of the light emitted from the light-emitting elements 14 passes through the sealing cavities 78 surrounded by the convex walls, i.e. the spacer 74, and enters the corresponding lens 72, but some of the light advances toward the convex walls. If the light reflected from the convex walls enters the lens 72, an image of the light emerging from the lens 72 is disturbed. Thanks to the tapered structure of the convex walls, it is possible to decrease the likelihood that the light reflected from the convex walls enters the lens 72.

The tapered convex walls can be easily formed by forming the entire sealing member 70 including the spacer 74 or forming the spacer 74 by a molding method using a mold. In the molding, since the mold has a sloped face provided to facilitate mold stripping, the convex walls are formed in the tapered shape so as to correspond to the sloped face of the mold. The method of forming the spacer 74 by a molding method using a mold will be described below.

Figure 16:
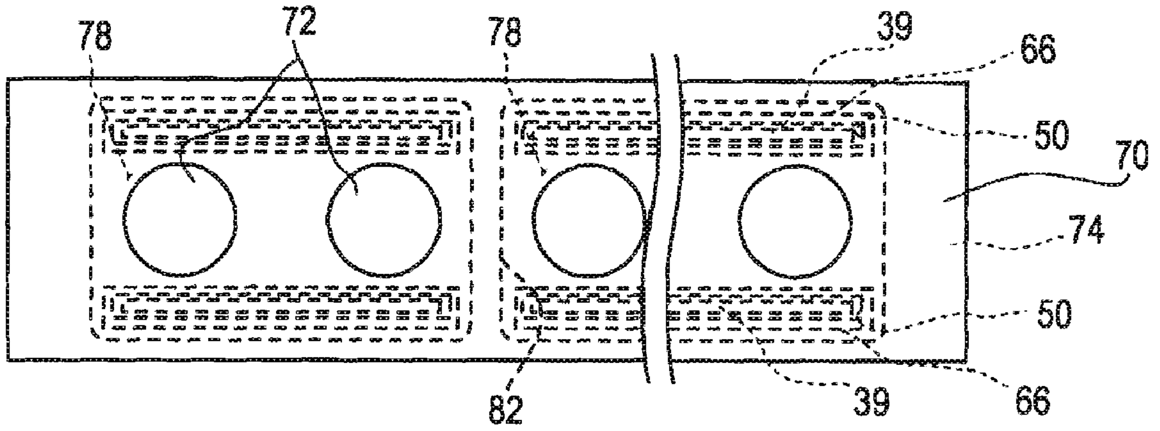
FIG. 16 is a plan view illustrating a light-emitting device according to a first modification of the third embodiment.

FIG. 16 shows a light-emitting device according to one modification of the third embodiment. In FIG. 16, like elements as in the third embodiments are represented by like reference symbols. In the light-emitting device according to this modification, two lenses 72 are disposed so as to correspond to each of the sealing cavities 78 provided to the spacer 74 in a manner of overlapping each sealing cavity 78. In each of the sealing cavities 78, a plurality of light-emitting elements 14 is disposed so as to overlap the two lenses 72. In this manner, two or more lenses 72 may overlap each of the sealing cavities 78. Further, the lens 52 having an oval shape as shown in FIG. 5 may be applied to the third embodiment.

Manufacturing Method of Sealing Member Used in Third Embodiment

Figure 17:
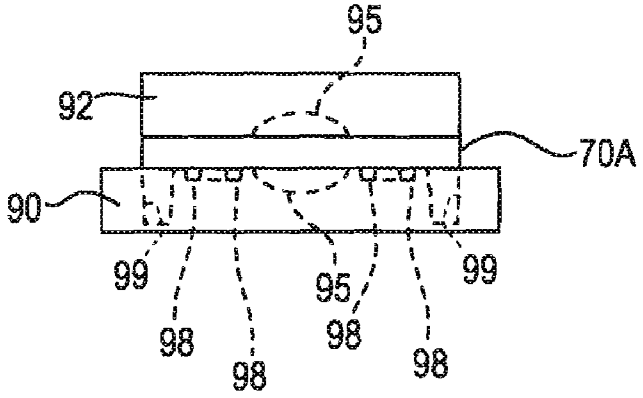
FIG. 17 is a perspective view illustrating a manufacturing method of a sealing member used in the light-emitting device according to the third embodiment.

FIG. 17 shows a manufacturing method of a sealing member 70 used in the light-emitting device according to the third embodiment. In this manufacturing method, a transparent flat plate member 70A which is the base material of the sealing member 70; a first mold 90, and a second mold 92 are used. It is preferable that the flat plate member 70A is made of glass. Each of the molds 90 and 92 is provided with lens-shaped grooves 95 for forming lenses 7A. The first mold 90 is provided with ditches 98 for forming protrusions 66 which define concave portions 50 receiving an absorbent 39 therein. Further, the first mold 90 is provided with convex wall-shaped grooves 99 for forming convex walls, i.e. the spacer 74.

The lens-shaped grooves 95, the ditches 98, and the convex wall-shaped grooves 99 of the molds 90 and 92 are filled with resin. It is preferable that transparent resin filling at least the lens-shaped grooves 95 has a cured refractive index similar to that of a material of the flat plate member 70A. Resin filling the ditches 98 and the convex wall-shaped grooves 99 may be the same material as the transparent resin filling the lens-shaped grooves 95 or may be different resin, for example black resin, which is different from the material filling the lens-shaped grooves 95. If the convex wall-shaped grooves 99 are filled with black resin, there is no need to coat a black material on the back of the spacer 74.

Next, the molds 90 and 92 are brought into tight contact with the flat plate member 70A so that the resin comes into contact with both surfaces of the flat plate member 70A. Further, the resin is cured, and then the molds 90 and 92 are separated from the flat plate member 70A after the curing. If the lenses 72 are plain-convex lenses, only the first mold 90 may be used. According to this manufacturing method, the lenses 72, the spacer 74, and the protrusions 66 defining the concave portions 50 are simultaneously formed on one surface of the flat plate member 70A, which consequently becomes the sealing member 70.

Fourth Embodiment

Figure 18:
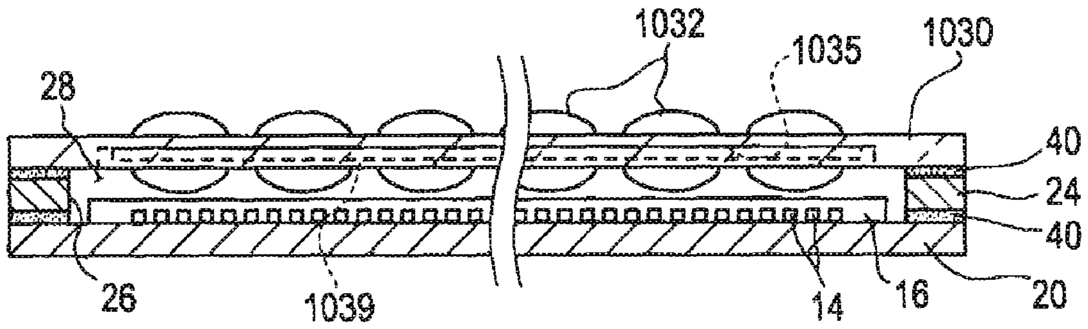
FIG. 18 is a front-side sectional view illustrating a light-emitting device according to a fourth embodiment of the invention.
Figure 19:
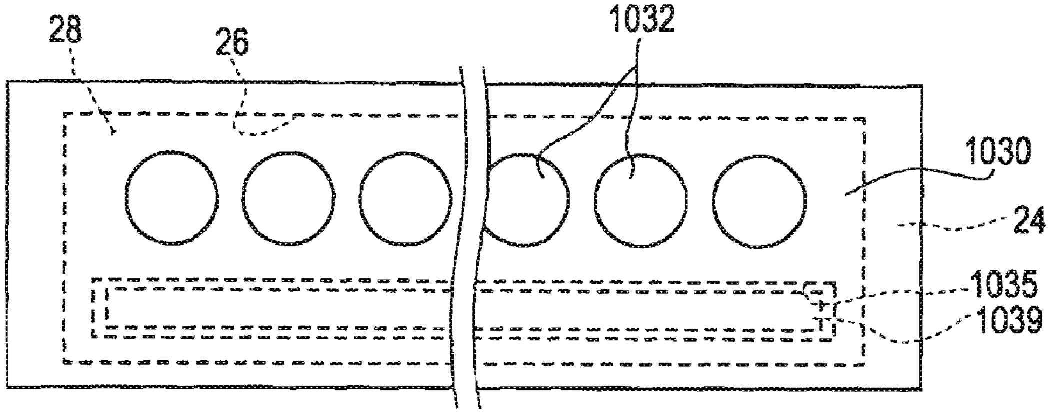
FIG. 19 is a plan view illustrating the light-emitting device shown in FIG. 1.

FIG. 18 is a front-side sectional view illustrating a light-emitting device according to a fourth embodiment of the invention, and FIG. 19 is a plan view corresponding to the view of FIG. 18. The light-emitting device is used as a line-type head, i.e. exposure device, which produces a latent image by irradiating light on the surface of an image carrier (for example, photosensitive drum) in an electro-photographic type image printing apparatus.

The light-emitting device includes an element substrate 20 which has a flat plate shape and is made of a proper material such as glass, resin, ceramic, and metal. A plurality of light-emitting elements 14 is arranged on the element substrate 20. In this embodiment, the light-emitting elements 14 are organic EL elements performing surface emission. Accordingly, each of the light-emitting elements 14 includes a light-emitting layer made of an organic material and emitting light in response to current, a positive electrode, and a negative electrode having the light-emitting layer therebetween for flowing current through the light-emitting layer. In addition to the light-emitting layer, a variety of kinds of layers which transport or inject holes and electrons to or into the light-emitting layer may be disposed between the positive electrode and the negative electrode. However, details of the light-emitting elements are not shoe in the drawings.

A light-emitting panel having the element substrate 20 and the light-emitting elements 14 is a top emission type light-emitting panel, and thus light emitted from the light-emitting elements 14 is emitted toward the opposite side of the element substrate 20, i.e. the upper side of FIG. 18. A passivation layer, i.e. protective film 16, made of a transparent insulation member such as silicon dioxide or silicon nitride is disposed so as to surround the light-emitting elements 14. The protective film 16 is provided in order to prevent the organic material of the light-emitting element 14 from deteriorating due to oxygen or moisture.

A sealing member 1030 having a plate shape overlaps the element substrate 20. The sealing member 1030 seals up the plurality of light-emitting elements 14 together with the element substrate 20. The sealing member 1030 has a lens array in which a plurality of lenses 1032 is arranged. In other words, the sealing member 1030 is the lens array. The lenses 1032 refract the light emitted from the light-emitting elements 14 and allow the refracted light to pass therethrough.

As shown in FIGS. 18 and 19, the sealing member 1030 has biconvex lenses but may have other proper lenses such as plane-convex lenses. The sealing member 1030 is made of a material having high transmittance and good gas barrier properties. The material may be glass. The lenses may be formed on both surfaces or one surface of a sealing member, which is made of glass and has a plate shape, by transparent resin.

The sealing member 1030 may undergo antireflection treatment. The antireflection treatment may be performed with respect to the outer surfaces of the lenses on the lower side of FIG. 18, but to the outer surfaces of the lenses on the upper side of FIG. 18. Thanks to the antireflection treatment, it is possible to suppress the likelihood that light is reflected from the lower side of FIG. 18 and the light reflected from the light-emitting elements 20 enters the lenses, thereby disturbing the image.

A spacer 24 maintaining a distance between light-emitting elements 14 and lenses 1032 is disposed between the element substrate 20 and the sealing member 1030. In this embodiment, the spacer 24 is a separated member from the sealing member 1030 and bonded to the element substrate 20 and the sealing member 1030 by an adhesive 40. The adhesive 40 is made of a material having good gas barrier properties (for example, epoxy-based adhesive).

The spacer 24 is a frame-shaped body. That is, the spacer 24 is a flat plate having a penetration hole 26 at a center portion thereof. In the case in which the light-emitting device is assembled by using the element substrate 20, the sealing member 1030, and the spacer 24, the penetration hole 26 serves as a sealing cavity 28 sealed by the element substrate 20, the sealing member 1030, and the spacer 24. That is, the sealing cavity 28 is defined by the element substrate 20, the sealing member 1030, and the spacer 24.

It is preferable that the inside circumferential surface of the penetration hole 26 of the spacer 24 undergoes light absorption treatment. For example, a black material such as black resin containing titanium, titanium alloy, or both titanium and titanium alloy may be coated on the inside circumferential surface of the penetration hole 26. Alternatively, the entire spacer 24 is made of black resin.

A plurality of lenses 1032 is disposed so as to overlap the sealing cavities 28. A plurality of light-emitting elements 14 is disposed in each of the sealing cavities 28. As described below, an absorbent 1039 is disposed in each of the sealing cavities 28 for absorbing at least either one of moisture and oxygen. Thus, it is possible to suppress deterioration of the light-emitting elements 14 by the presence of the absorbent 1039. The inside of each of the sealing cavities 28 may be filled with inert gas such as nitrogen, helium, argon, and xenon. Thus, it is possible to suppress deterioration of the light-emitting elements 14 by the presence of the inert gas.

Each of the lenses 1032 of the sealing member 1030 allows the light emitted from the plurality of light-emitting elements 14 disposed so as to overlap the corresponding lens 1032 to pass therethrough. The light emerging from the lenses 1032 is an inverted image (point symmetric image) of the image of the light entering the lenses 1032. Accordingly, in this embodiment, the plurality of light-emitting elements 14 corresponding to each of the lenses 1032 is allocated with a signal of the inverted image, and the light emerging from the lens 1032 finally forms an upright image. Accordingly, the light emerging from the entire lenses 1032 form an upright image as a whole.

According to the light-emitting device according to the embodiment, since the sealing member 1030 itself is the lens array, it is possible to increase the reliability of the light-emitting device by increasing the thickness of the sealing member 1030 while suppressing a distance between the lens 1032 and the light-emitting element 14 to the minimum. Further, since there is no need to separately install the sealing member 1030 and the lens array, the number of parts of the light-emitting device is decreased. Still further, since there is no need to separately fix the sealing member 1030 and the lens array to the element substrate 20, the number of processes of a manufacturing method of the light-emitting device is decreased.

The lower surface of the sealing member 1030; which faces the sealing cavities 28, is provided with ditches, concave portions 1035, for receiving the absorbent 1039 therein. Since the lower surface of the sealing member 1030 faces the sealing cavities 28, the concave portions 1035 are disposed so as to communicate with the sealing cavities 28. The concave portions 1035 are elongate ditches which extend in the longitudinal direction of the sealing member 1030. By the presence of the concave portions 1035, it becomes easy to install the absorbent 1039 in the concave portions 1035. For example, the concave portions 1035 serve as landmarks for receiving the absorbent 1039 therein. Further, in the case of using the absorbent 1039 in gel state, it is easy to uniformly distribute the absorbent over the entire intended areas by the presence of the concave portions 1035, and it is possible to suppress the likelihood that the absorbent in gel state flows and thus is attached to the lenses 1032.

Figure 20:
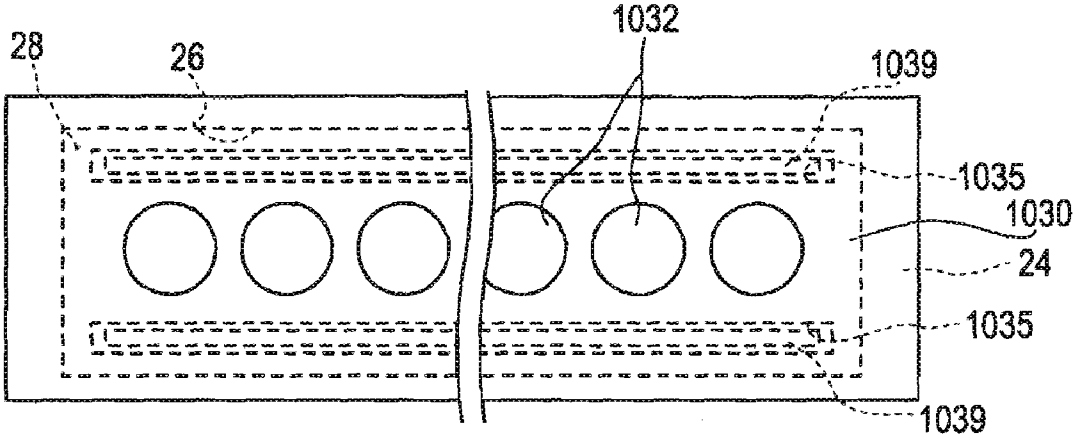
FIG. 20 is a plan view illustrating a light-emitting device according to a first modification of the fourth embodiment.

FIG. 20 shows a light-emitting device according to a modification of the fourth embodiment. In FIG. 20, like elements as in the fourth embodiment is represented by like reference symbols in the light-emitting device according to this modifications the lower surface of a sealing member 1030 facing sealing cavities 238 is provided with two ditches, i.e. concave portions 1035. Each of the concave portions 1035 is provided with an absorbent 1039. Since the lower surface of the sealing member 1039 is disposed so as to face the sealing cavities 28, the concave portions 1035 are configured so as to communicate with the sealing cavities 28. In the same manner shown in FIG. 19, the concave portions 1035 are elongate ditches which extend in the longitudinal direction of the sealing member 1030.

Figure 21:
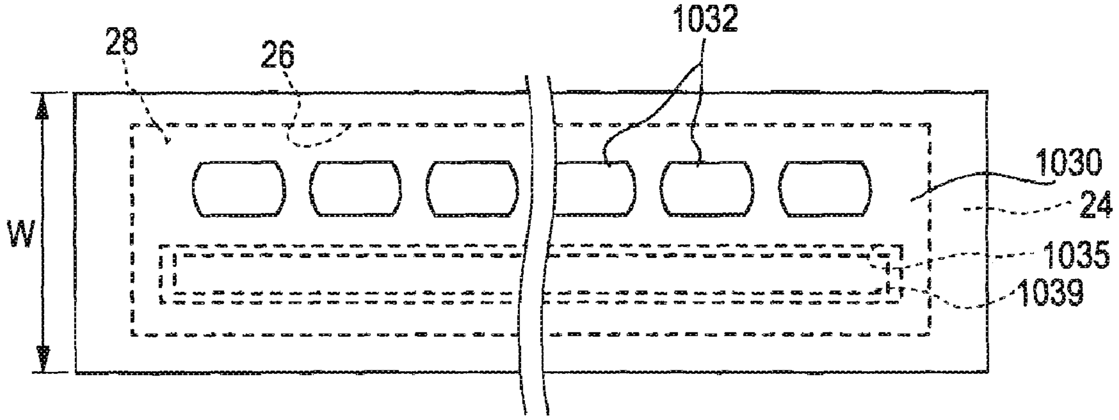
FIG. 21 is a plan view illustrating a light-emitting device according to a second modification of the fourth embodiment.
Figure 22:
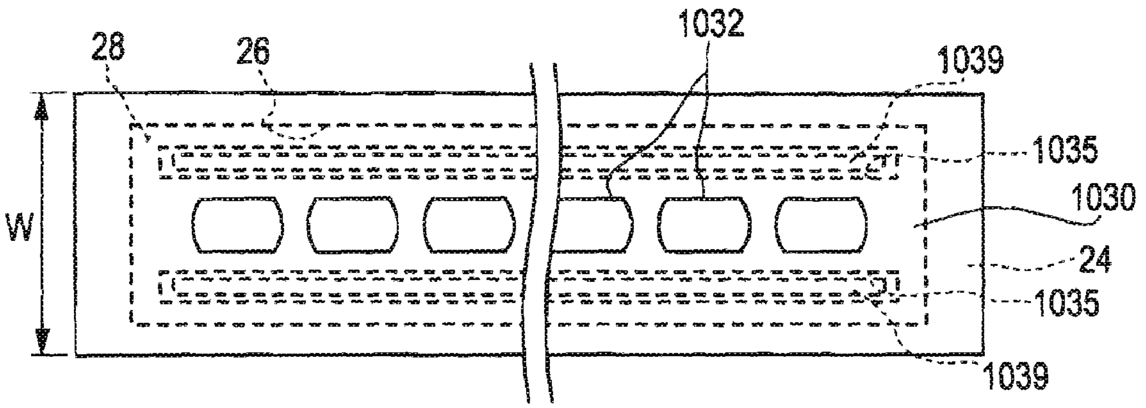
FIG. 22 is a plan view illustrating a light-emitting device according to a third modification of the fourth embodiment.

FIGS. 21 and 22 shows a light-emitting device according to another modification of the fourth embodiment. In FIGS. 21 and 22, like elements as in the fourth embodiment are represented by like reference symbols. In the light-emitting device according to this modification, the sealing member 1030 is provided with the lenses 52 rather than the lenses 1032. The lenses 52 have a curvature the same as that of the lenses 1032. However, the lenses 1032 has a circular shape when it is viewed in an optical axis direction (in a direction perpendicular to the surface of paper shown in FIG. 19) butt the lenses 52 have an oval shape when it is viewed in an optical axis direction (a direction perpendicular to the surface of paper shown in FIGS. 21 and 22). In greater detail, the lenses 52 have a shape which looks like the remaining of a circular shape the top and bottom ends of which are cut away along straight line). If the longitudinal direction of the lenses 52 is set to be in parallel with the longitudinal direction of the light-emitting device by the use of the lenses 52, it is possible to decrease the width W of the light-emitting device.

Manufacturing Method of Sealing Member Used in Fourth Embodiment.

Figure 23:
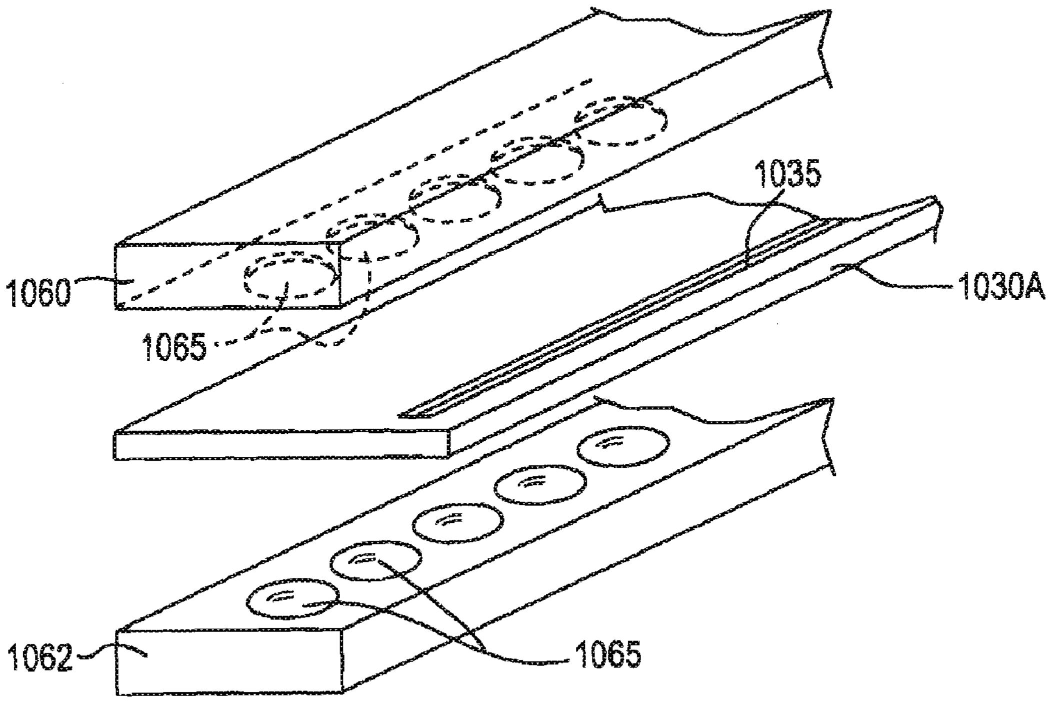
FIG. 23 is a perspective view illustrating a manufacturing method of a sealing member used in the light-emitting devices according to the fourth embodiment and a fifth embodiment.

FIG. 23 shows a manufacturing method of the sealing member 1030 used. In the light-emitting device according to the fourth embodiment. In this manufacturing method, a transparent flat plate member 1030A which is a base material of the sealing member 1030, a first mold 1060, and a second mold 1062 are used. It is preferable that the flat plate member 1030A is made of glass. The flat plate member 1030A is preliminarily provided with concave portions 1035. The molds 1060 and 1062 are provided with lens-shaped grooves 1065 for forming the lenses 1032.

The lens-shaped grooves 1065 of the molds 1060 and 1062 are filled with transparent resin. It is preferable that the transparent resin has a cured refractive index similar to that of the flat plate member 1030A. Next, the molds 1060 and 1062 are brought into tight contact with the flat plate member 1030A so that both surfaces of the flat plate member 1030A come into contact with the transparent resin. Further, after the transparent resin is cured, the molds 1060 and 1062 are separated from the flat plate member 1030A. Through the above procedure, it is possible to manufacture the sealing member 1030 having the lenses 1032 and the concave portions 1035 in a simple manner. Further, if the lenses 1032 are plane-convex lenses, it is satisfactory that only either one of the molds 1060 and 1062 may be used.

Figure 24:
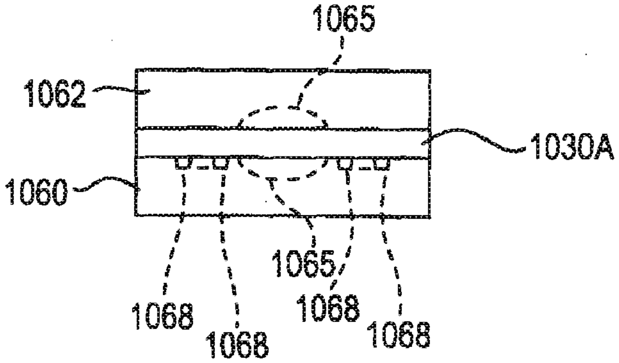
FIG. 24 is a side view illustrating a manufacturing method according to a modification of the manufacturing method shown in FIG. 23.
Figure 25:
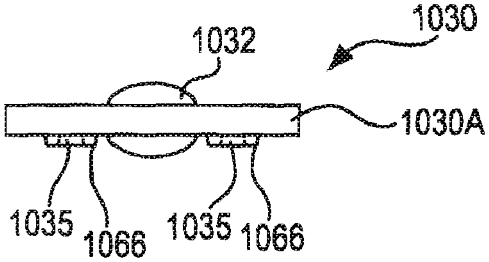
FIG. 25 is a side view illustrating a sealing member manufactured by the manufacturing method shown in FIG. 23.

FIG. 24 shows a manufacturing method according to a modification of the method shown in FIG. 23. In this manufacturing method, the sealing member 1030 shown in FIG. 25 is used. As shown in FIG. 25, in the sealing member 1030, two protrusions 66 are formed on one surface of the base material 1030A. The protrusions 1066 are provided with concave portions 1035; (ditches) for installing the absorbent 1039.

In this manufacturing method, the transparent flat plate member 1030A which is a base material of the sealing member 1030, the first mold 1060, and the second mold 1062 are used. It is preferable that the flat plate mender 1030A is made of glass. Each of the molds 1060 and 1062 is provided with lens-shaped grooves 1065 for forming the lenses 1068. Further, the first mold 1060 is provided with ditches 1068 for forming protrusions defining concave portions 1035.

The lens-shaped grooves 1065 and the ditches 1068 of the molds 1060 and 1062 are filled with resin. It is preferable that the resin filling at least the lens-shaped grooves 1065 is transparent resin having a cured refractive index similar to that of the flat plate member 1030A. The resin filling the ditches 1068 may be the same transparent resin filling in the lens-shaped grooves 1065 or may be different resin, for example black resin.

Next, the molds 1060 and 1062 are brought into tight contact with the flat plate member 1030A so that the resin comes into contact with both surfaces of the flat plate member 1030A. Further, the resin is cured, and the molds 1060 and 1062 are separated from the plate member 1030A after the curing. If the lenses 1032 are plane-convex lenses, it is satisfactory that only the first mold 1060 may be used. According to this manufacturing method, it is possible to simultaneously form the lenses 1032 and the protrusions 1066 defining two concave portions 1035 on the flat plate member 1030A which consequently becomes the sealing member 1030.

Fifth Embodiment

Figure 26:
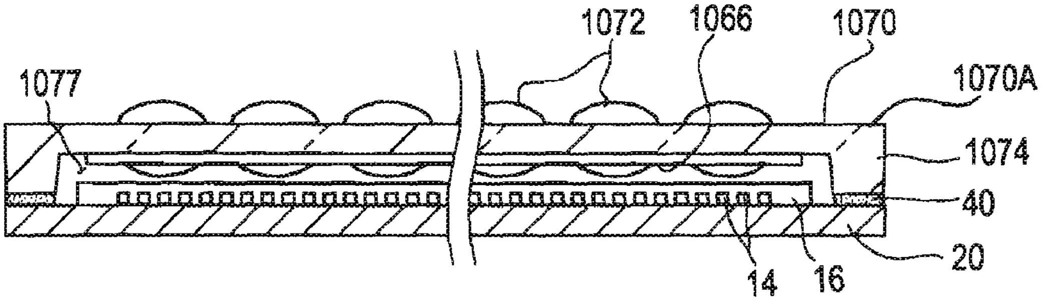
FIG. 26 is a front-side sectional view illustrating a light-emitting device according to the fifth embodiment of the invention.
Figure 27:
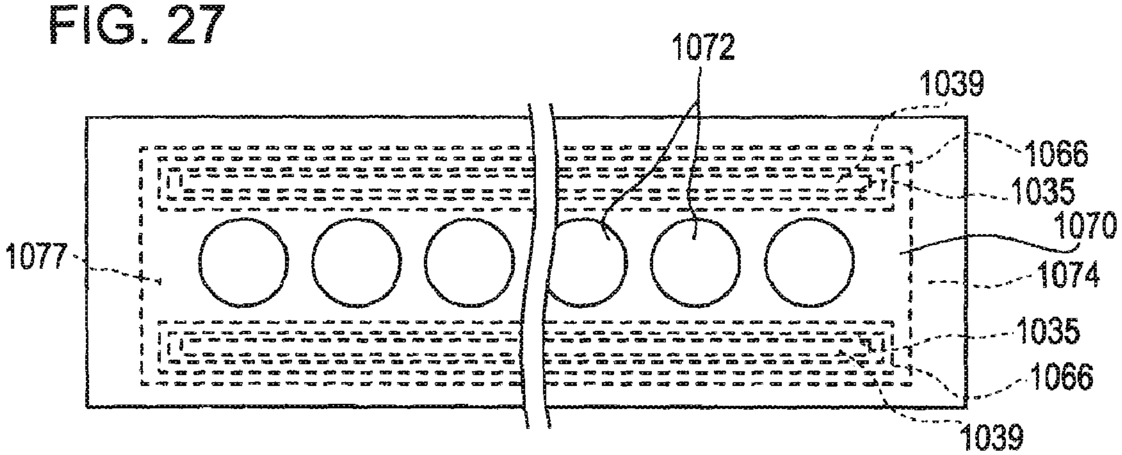
FIG. 27 is a plan view illustrating the light-emitting device shown in FIG. 26.
Figure 28:
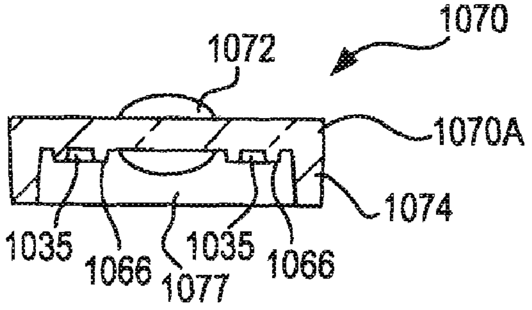
FIG. 28 is a cross-sectional view illustrating a sealing member used in the light-emitting device according to the fifth embodiment.

FIG. 26 is a front-side sectional view illustrating a light-emitting device according to a fifth embodiment of the invention. FIG. 27 is a plan view corresponding to the view shown on FIG. 26. FIG. 28 is a cross-sectional view illustrating a sealing member 1070 used in the light-emitting device shown in FIG. 26. In FIGS. 26 to 28, like elements as in the fourth embodiment are represented by like reference symbols. In this embodiment, the same element substrate 20 as in the fourth embodiment is used.

The plate-shaped sealing member 1070 overlaps the element substrate 20. The sealing member 1070 seals a plurality of light-emitting elements 14 together with the element substrate 20. The sealing member 1070 has a lens array in which a plurality of lenses 1072 is arranged. In other words, the sealing member 1070 itself is the lens array.

As shown in FIGS. 26 to 28, the sealing member 1070 is provided with biconvex lenses, but may be provided with plane-convex lenses or different proper lenses. The sealing member 1070 is made of a material having high transmittance and good bas barrier properties. Such a material may be glass. The lenses may be formed on one surface or both surfaces of a flat plate member 1070A, which is a transparent member made of glass and which is a base material of the sealing member 1070, with transparent resin. As in the fourth embodiment, the sealing member 1070 may undergo antireflection treatment.

A spacer 1074 maintaining a distance between light-emitting elements 14 and lenses 1072 is disposed between the element substrate 20 and the sealing member 1070. In this embodiment, the spacer 1074 is convex walls integrated with the flat plate member 1070A which is a transparent base material of the sealing member 1070. Here, the term integrated means both a structure in which two objects are made of the same material and a structure in which the spacer 1074 and the flat plate member 1070A are made of different materials but fixed to each other so that they are not separated from each other as long as they break by external force. Since the spacer 1074 is integrated with the sealing member 1070, it is easy to fix the spacer 1074 and the sealing member 1070 to the element substrate 20.

The spacer 1074 is bonded to the element substrate 20 by an adhesive 40. The adhesive 40 is a material having good gas barrier properties, such as epoxy-based adhesive.

The spacer 1074, which is convex walls of the sealing member 1070, are provided with sealing cavities 1077. In the case in which the light-emitting device is constructed by combining the element substrate 20 and the sealing member 1070, the sealing cavities 1077 are sealed up by the element substrate 20 and the sealing member 1070. That is, the sealing cavities 1077 are defined by the element substrate 20 and the sealing member 1070.

It is preferable that at least the inside circumferential surface of each of the sealing cavities 1077 of the spacer 1074 may undergo light absorption treatment. For example, a black material such as black resin containing titanium, titanium alloy, or both titanium and titanium alloy is coated on the inside circumferential surface of each of the sealing cavities 1077. Alternatively, in the case in which the spacer 1074 and the flat plate member 1070A are made of different materials, the entire spacer 1074 is made of black resin.

A plurality of lenses 1072 disposed to overlap the sealing cavities 1077 and light-emitting elements 14 are disposed in the sealing cavities 1077. An absorbent 1039 is disposed inside each of the sealing cavities 1077 for absorbing at least either one of moisture and oxygen. Thanks to the absorbent 1039, it is possible to suppress deterioration of the light-emitting elements 14. In the sealing member 1070, two protrusions 1066 are formed on the lower surface or the base material 1070A, which faces the sealing cavities 1077. The protrusions are provided with concave portions 1035 (ditches) in which the absorbent 1039 is disposed. Since the lower surface of the sealing member 1070 faces the sealing cavities 1077, the concave portions 1035 are disposed to communicate with the sealing cavities 1077. The concave portions 1035 are elongate ditches which extend in the longitudinal direction of the sealing member 1070. As described above in association with the fourth embodiment, it becomes easy to install the absorbent due to the presence of the concave portions 1035. Further, the sealing cavities 1077 are filled with inert gas such as nitrogen, helium, argon, and xenon. Accordingly, it is possible to suppress deterioration of the light-emitting elements 14 due to the presence of the inert gas.

Each of the lenses 1072 of the sealing member 1070 allows light emitted from the plurality of light-emitting elements 14 disposed to overlap the corresponding lens to pass therethrough. As described above in association with the fourth embodiment, in this embodiment, the plurality of light-emitting elements 14 corresponding to each of the lenses 1072 is allocated with a signal of an inverted image, and thus the light emerging from the corresponding lens 1072 forms an upright image.

As shown in FIGS. 26 to 28, the spacer 1074, i.e. the convex walls of the sealing member 1070, is formed in a tapered form in a manner such that it becomes narrower as it becomes farther from the flat plate member 1070A. Most of the light emitted from the light-emitting elements 14 passes through the sealing cavities 1077 surrounded by the convex walls, i.e. the spacer 1074, and enters the lenses 1072, but some of the light advances toward the convex walls. If the light reflected from the convex walls enters the lenses 1072, the image of the light emerging from the lenses 1072 is disturbed. Accordingly, it is possible to suppress the likelihood that the light reflected from the convex walls enters the lenses 1072 by employing the convex walls in a tapered form.

The convex walls having the above-described structure can be easily formed by forming the entire sealing member 1070 including the spacer 1074 or forming the spacer 1074 by a molding method using a mold. In the molding method, the mold has a sloped surface for facilitating mold stripping. Accordingly, the convex walls are formed in the tapered form corresponding to the sloped surface. A method of forming the spacer 1074 by a molding method using a mold will be described below.

Figure 29:
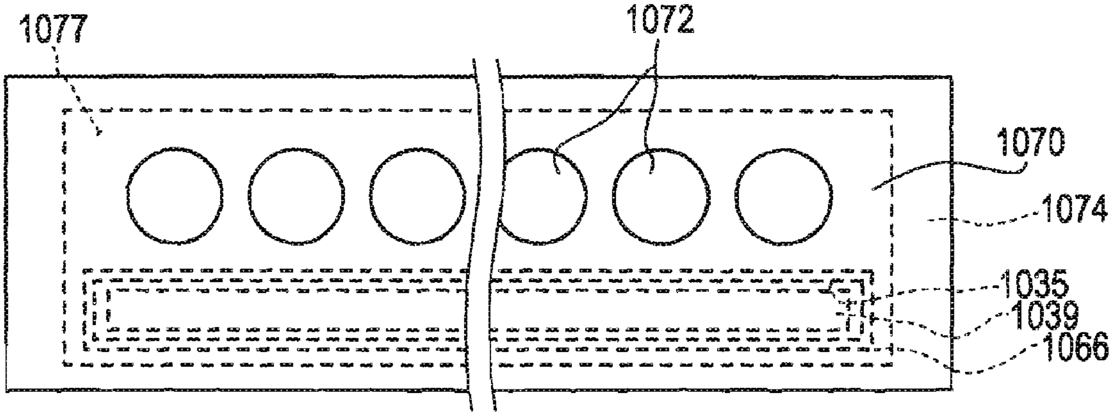
FIG. 29 is a plan view illustrating a light-emitting device according to a modification of the fit embodiment.

FIG. 29 shows a light-emitting device according to a modification of the fifth embodiment. In FIG. 29, like elements as in the fifth embodiment are represented by like reference symbols. In the light-emitting device according to this modification, the lower surface of the sealing member 1070, which faces sealing cavities 1077, is provided with protrusions 1066, and each of the protrusions 1066 is provided with ditches, concave portions 1035. In each of the concave portions 1035, an absorbent 1039 is disposed. Since the lower surface of the sealing member 1070 faces the sealing cavities 1077, the concave portions 1035 are disposed so as to communicate with the sealing cavities 1077. As in FIG. 27, the concave portions 1035 are elongate ditches which extend in the longitudinal direction of the sealing member 1070. The oval-shaped lenses 52 shown in FIGS. 21 and 22 may be applied to the fifth embodiment.

Manufacturing Method of Sealing Member Used in Fifth Embodiment.

Figure 30:
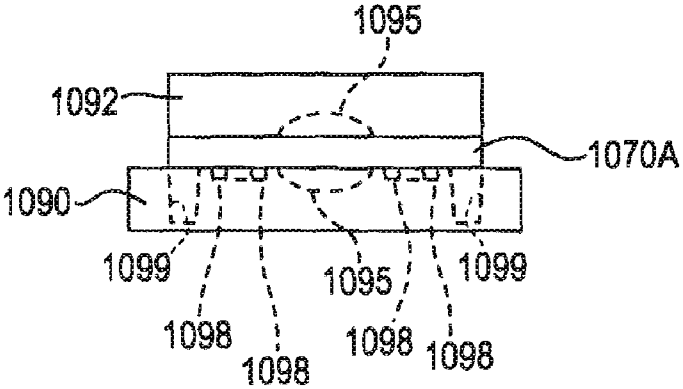
FIG. 30 is a side view illustrating a manufacturing method of a sealing member used in the light-emitting device according to the fifth embodiment.

FIG. 30 shows a manufacturing method of the sealing member 1070 used in the light-emitting device according to the fifth embodiment. In this manufacturing method, a flat plate member 1070A which is transparent and is a base material of the sealing member 1070, a first mold 1090, and a second mold 1092 are used. It is preferable that the flat plate member 1070A is made of glass. Each of the molds 1090 and 1092 is provided with lens-shaped grooves 1095 for forming lenses 1072. The first mold 1090 is provided with ditches 1098 for forming protrusions 1066 which define the concave portions 1035 in which an absorbent 1039 is disposed. In addition, the first mold 1090 is provided with convex wall-shaped grooves 1099 for forming the convex walls, i.e. the spacer 1074.

The lens-shaped grooves 10995, the ditches 1098, and the convex wall-shaped grooves 1099 of the molds 1090 and 1092 are filled with resin. It is preferable that the resin filling at least the lens-shaped grooves 1095 is transparent resin having a cured refractive index similar to that of the flat plate member 1070A. The resin filling the ditches 1098 and the convex wall-shaped grooves 1099 may be the same resin filling the lens-shaped grooves 1095 or may be different resin, for example, black resin. If the convex wall-shaped grooves 1099 are filled with black resin, there is no need to form a coating layer of a black material on the back side of the spacer 1074.

Next, the molds 1090 and 1092 are brought into tight contact with the flat plate member 1070A so that the resin comes into contact with both surfaces of the flat plate member 1070A. Further, the resin is cured, and the molds 1090 and 1092 are separated from the plate member 11070A after the curing. Further, the lenses 1072 are plane-convex lenses, it is satisfactory only the first mold 1090 may be used. According to this manufacturing method, the lenses 1072, the spacer 1074, and the protrusions 1066 defining the concave portions 1035 are simultaneously formed on the surface of the flat plate member 1070A, which results in the sealing member 1070.

Other Modifications

In the above-described embodiments, the light-emitting elements 14 are organic EL elements, but may be inorganic EL elements or LED elements.

In the above-described embodiments, each of the lenses is disposed so as to overlap a plurality of light-emitting elements 14 and allows light emitted from the plurality of light-emitting elements 14 overlapping the corresponding lens to pass therethrough. However, each of the lenses may be disposed so as to overlap only one light-emitting element, and thus the lens may allow light emitted from the light-emitting element corresponding to the lens to pass there through.

Image Printing Apparatus

Figure 31:
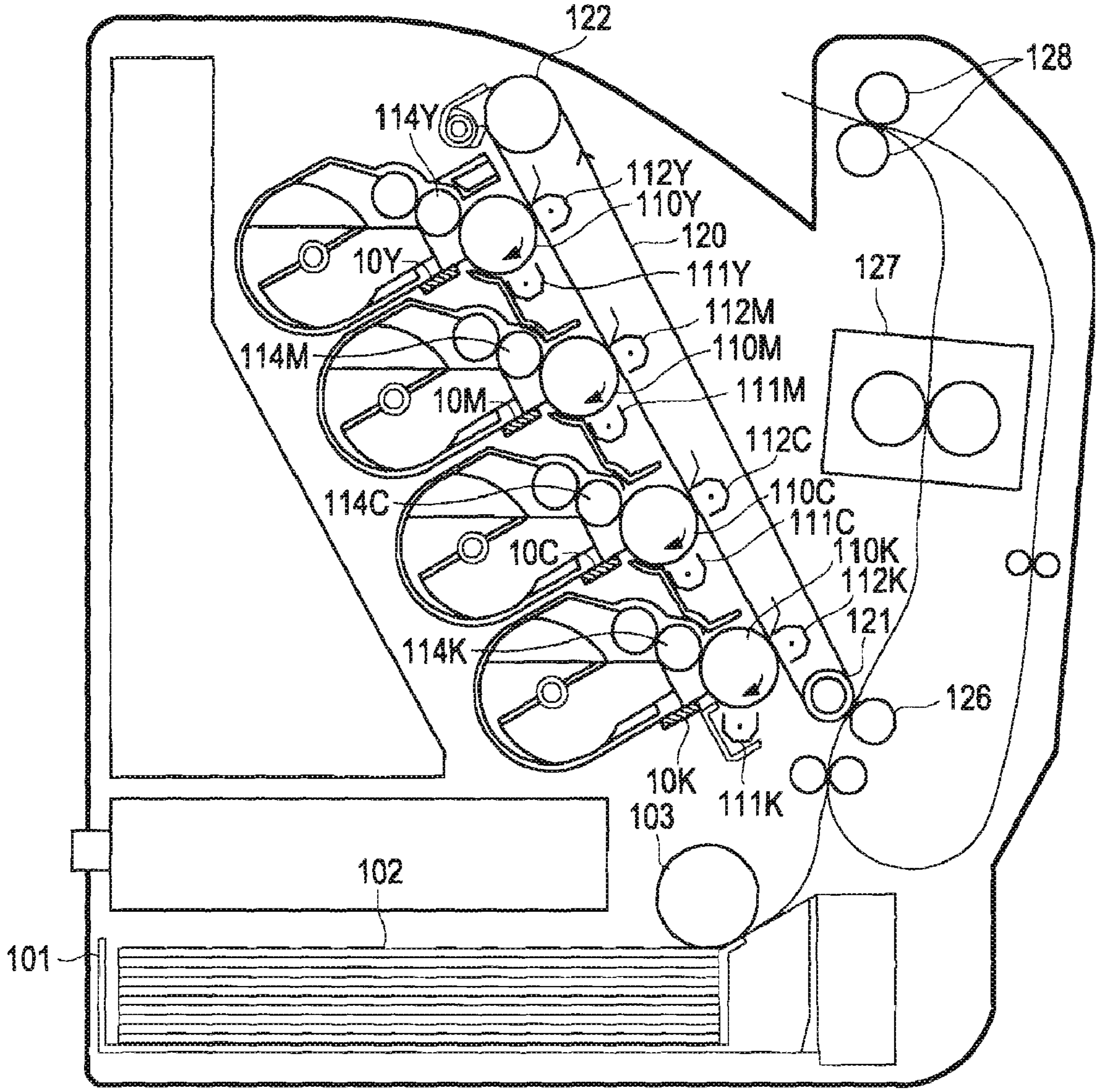
FIG. 31 is a longitudinal-sectional view illustrating an image printing apparatus according to one embodiment of the invention.

FIG. 31 is a longitudinal-sectional view illustrating an image printing apparatus according to one embodiment. The image printing apparatus is a full-color image printing apparatus based on a head intermediate transfer system.

In this image printing apparatus, four organic EL array exposure heads 10K, 10C, 10M, and 10Y having the same structure are disposed at exposing positions of four photosensitive drums (image carriers) 110K, 110C, 100M, and 110Y having the same structure, respectively. Each of the organic EL array exposure heads 10K, 10C, 10M, and 10Y is any one of light-emitting devices which are described above.

As shown in wig 31, the image printing apparatus includes a driving roller 121 and a driven roller 122. An endless intermediate transfer belt 120 is wound around the driving roller 121 and the driven roller 12 and thus revolves around the driving roller 121 and the driven roller 122 in a direction indicated by the arrow. Although not shown in the drawings, a tension imparting means such as a tension roller which imparts tension to the intermediate transfer belt 120 may be employed.

Around the intermediate transfer belt 120, four photosensitive drums 110K, 110C, 110M, and 110Y each having a photosensitive layer on the outer surface thereof are disposed so as to be spaced apart from each other by a predetermined distance. Suffix letters K, C, M, and Y mean that the elements represented by the suffix letters are used to develop black, Cyan, Magenta, and Yellow images, respectively. The meaning is applied to other elements in the same manner. Each of the photosensitive drums 110K, 110C, 110M, and 110Y is rotationally driven in synchronization with driving of the intermediate transfer belt 120.

Corona chargers 111K, 111C, 11M, and 111Y, organic EL array exposure heads 10K, 10C, 10M, and 10Y, and developers 114K, 114C, 114M, and 114Y are disposed around the photosensitive drums 110K, 110C, 110M, and 110Y, respectively. The corona chargers 111K, 111C, 111M, and lily uniformly charge the outer circumferential surfaces of the corresponding photosensitive drums 110K, 110C, 110M, and 110Y, respectively. The organic EL array exposure heads 10K, 10C, 10M, and 10Y produce latent images on the outer surfaces of the charged outer circumferential surfaces of the corresponding photosensitive drums 110K, 110C, 110M, and 110Y. The organic EL array exposure heads 10K, 10C, 10M, and 10Y are arranged in a manner such that the plurality of light-emitting elements 14 are arranged in a bus line direction of photosensitive drums 110K, 110C, 110M, and 110Y. Production of electrostatic latent images is performed by irradiating light emitted from the plurality of light-emitting elements 14 on the photosensitive drums 110K, 110C, 110M, and 110Y. The developers 114K, 114C, 114M, and 114Y form visible images by attaching toners, developing agents, to the electrostatic latent images.

Black, cyan, magenta, and yellow visible images formed by four mono-color visible image forming stations are transferred onto the intermediate transfer belt 120 in turns, and thus they overlap in turns on the intermediate transfer belt 120. As a result, a full-color visible image can be obtained. Four primary transfer corotrons (transcribers) 112K, 112C, 112M, and 112Y are disposed inside the intermediate transfer belt 120. The primary transfer corotrons 112K, 112C, 112M, and 112Y are disposed near the photosensitive drums 110K, 110C, 110M, and 110Y, respectively, and electrostatically draw the latent images on the photosensitive drums 110K, 110C, 110M, and 110Y. As a result, the latent images are transferred to the intermediate transfer belt 120 passing through a gap between the photosensitive drums and the primary transfer corotrons.

Finally, a sheet 102, which is an object on which an image is formed, is fed one by one by a pick-up roller 103 from a paper feeding cassette 101 and sent to a nip between the intermediate transfer belt 120 in contact with the driving roller 121 and a secondary transfer roller 126. The full-color visible image on the intermediate transfer belt 120 is secondarily transferred to the surface of the sheet 102 by the secondary transfer roller 126 in a lump, and passes through a pair of fixing rollers 127 which is a fixing unit. As a result, the full-color visible image is fixed on the sheet 102. After that, the sheet 102 is discharged onto a paper discharge cassette provided to an upper portion of the image printing apparatus.

Figure 32:
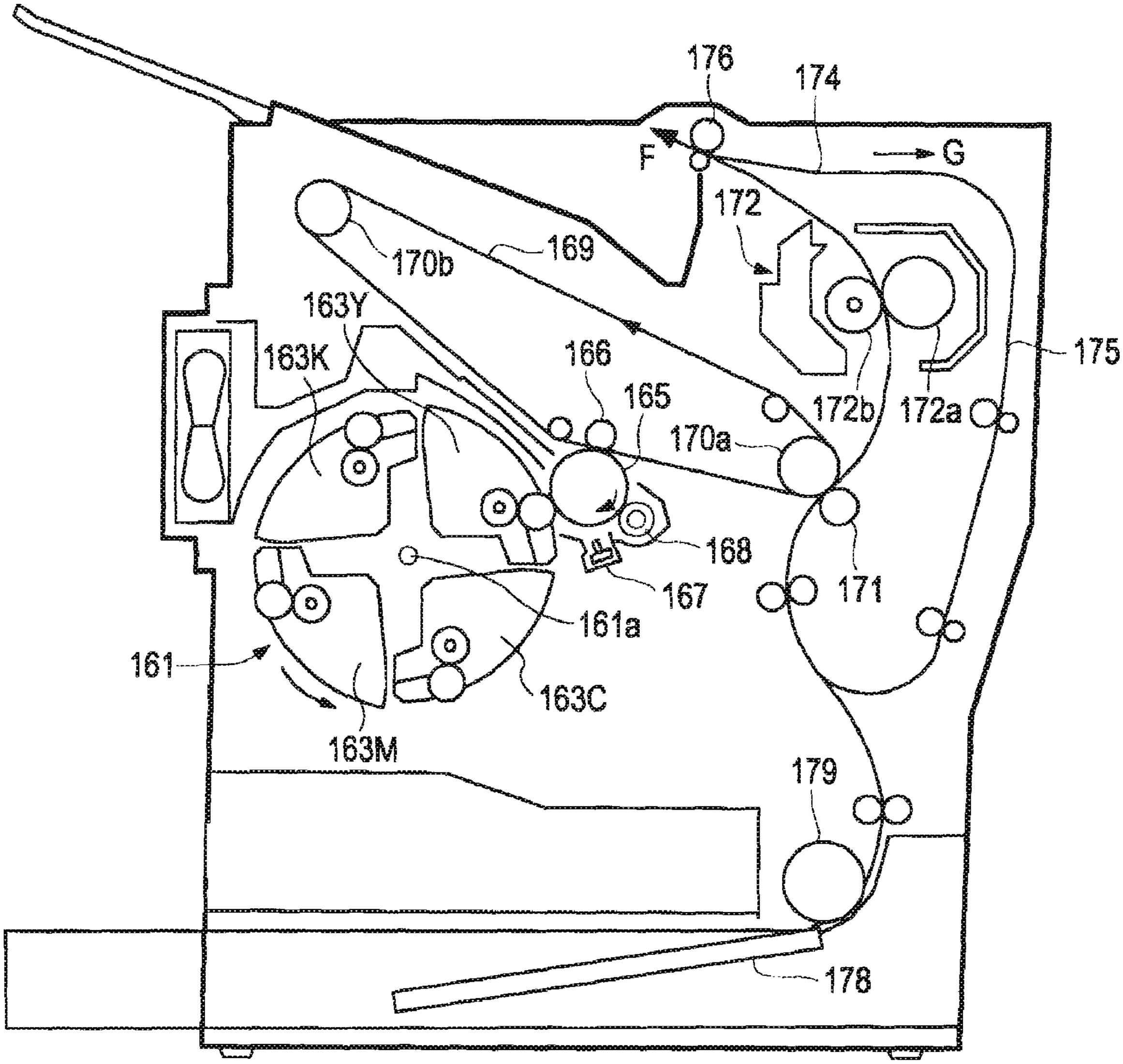
FIG. 32 is a longitudinal-sectional view illustrating an image printing apparatus according to another embodiment of the invention.

FIG. 32 is a longitudinal-sectional view illustrating an image printing apparatus according to another embodiment of the invention. The image printing apparatus according to this embodiment is a rotary developing type full-color image printing apparatus based on a head intermediate transfer system. In the image printing apparatus shown in FIG. 32, a corona charger 168, a rotary-type developing unit 161, an organic EL array exposure head 167, and an intermediate transfer belt 169 are disposed around a photosensitive drum (image carrier) 165.

The corona charger 168 uniformly charges the outer circumferential surface of the photosensitive drum 165. The organic EL array exposure head 167 produces an electrostatic latent image on the outer circumferential surface of the photosensitive drum 165, which is charged. The organic EL array exposure head 167 is any one of the light-emitting devices described above. The organic EL array exposure head 167 is disposed in a manner such that a plurality of light-emitting elements 14 is arranged in a bus line direction (primary scan direction) of the photosensitive drum 165. Production of the electrostatic latent image is performed by irradiating light emitted from the plurality of light-emitting devices 14 on the photosensitive drum 165.

The developing unit 161 is a drum in which four developers 163Y, 163C, 163M, and 163K are arranged at an angle of 90° and rotates in counterclockwise direction about a shaft 161*a*. The developers 163Y, 163C, 163M, and 163K supply yellow toner, cyan toner, magenta toner, and black toner to the photosensitive drum 165, thereby developing the electrostatic latent images (i.e. forming a visible image form the electrostatic latent images) by attaching toners serving as developing agents to the electrostatic latent images.

An endless intermediate transfer belt 169 is wound around a driving roller 170*a*, a driven roller 170*b*, a primary transfer roller 166, and a tension roller, and thus revolves around the rollers in a direction indicated by the arrow. The primary transfer roller 166 transfers the visible image to the intermediate transfer belt 169 passing through a gap between the photosensitive drum 165 and the primary transfer roller 166 by electrostatically drawing the visible image from the photosensitive drum 165.

In greater detail, an electrostatic latent image for a yellow Y image is produced by the exposure head 167 by a first rotation of the photosensitive drum 165, a yellow visual image is formed by the developer 163Y, and then the yellow visual image is transferred to the intermediate transfer belt 169. Next, an electrostatic latent image for a cyan C image is produced by the exposure head 167 by a next rotation of the photosensitive drum 163, a cyan visual image is formed by the developer 163C, and then the cyan visual image is transferred to the intermediate transfer belt 169 so as to overlap the yellow visual image. Thus, in this manner, while the photosensitive drum 9 rotates four times, a yellow visual image, a cyan visual image, a magenta visual image, and a black visual image are formed on the intermediate transfer belt 169 so as to overlap in turns. Thus, in the case of forming an image on both surfaces of a sheet which is a recording object, the same color of images are transferred to the front surface and the back surface of the intermediate transfer belt 169, and then another color of visual images are transferred to the front and back surfaces of the intermediate transfer belt 169. Thus, a full-color visual image can be formed on the intermediate transfer belt 169.

The image printing apparatus includes a sheet path 174 along which a sheet moves. The sheet is discharged out of a paper feeding cassette by a pick-up roller 179 one by one, travels along the sheet path 174 by a transporting roller, and passes a nip between the intermediate transfer belt 169 in contact with a driving roller 170*a* and a secondary transfer roller 171. The secondary transfer-roller 171 transfers the visual image on the intermediate transfer belt 169 to one surface of the sheet by electrostatically drawing the colored visual image from the intermediate transfer belt 169 in a lump. The secondary transfer roller 171 is configured so as to approach the intermediate transfer belt 169 or separate from the intermediate transfer belt 169 by a clutch which is not shown. Thus, the secondary transfer roller 171 comes into contact with the intermediate transfer belt 169 when the full-color visual images are transferred to the sheet, and is separated from the intermediate transfer belt 169 while the colored visual images overlap in turns on the intermediate transfer belt 169.

The sheet, on which the image is transferred in such manner, is transported to a fixing unit 172, and then passes a gap between a heating roller 172*a* and a pressing roller 172*b* of a fixing unit. As a result, the visual image is fixed on the sheet. The sheet is drawn into a pair of paper discharge rollers 176 and travels in a direction of the arrow F after the fixing treatment. In the case of double-side printing, after most part of the sheet passes through a gap between the pair of paper discharge rollers 176, the pair of paper discharge rollers 176 rotates in the reverse direction and thus the sheet is introduced into a double-side printing paper path 175 as indicated by the arrow G. Thus, the visual image is transferred to the both surface of the sheet by the secondary transfer roller 171, the fixing treatment is performed by the fixing unit 172 again, and the sheet is discharged by the pair of paper discharge rollers 176.

Hereinbefore, an exemplary image printing apparatus, to which any of the light-emitting devices described above is applied, is described, but the above-described light-emitting devices can be applied to different electro-photographic type image printing apparatuses. Thus, such image printing apparatuses is within the scope of the invention. For example, the light-emitting devices can be applied to an image printing apparatus in which the visual image is directly transferred from the photoconductive drum to the sheet without using the intermediate transfer belt, or an image printing apparatus forming a monochrome image.

What is claimed is:

1. A light-emitting device comprising:

a plurality of light-emitting elements;

an element substrate on which the plurality of light-emitting elements are disposed;

a plate-shaped sealing member having a lens array in which a plurality of lenses are arranged and sealing the plurality of light-emitting elements together with the element substrate;

a spacer disposed between the element substrate and the plate-shaped sealing member for maintaining a distance between the light-emitting elements and the lenses, the spacer including inclined portions integrated with the sealing member, the inclined portions being formed in a tapered shape in a manner such that the spacer becomes narrower as it becomes farther from the sealing member, the spacer being provided with a plurality of sealing cavities such that the spacer is disposed between each sealing cavity, at least one lens of the plurality of lenses being disposed so as to overlap each of the sealing cavities, and the light-emitting elements are disposed in each of the sealing cavities so as to overlap the corresponding lenses; and an absorbent that absorbs at least either one of moisture and oxygen, the absorbent being disposed in each of the sealing cavities.

2. The light-emitting device according to claim 1, wherein the sealing member is provided with groove portions in which the absorbent is disposed.

3. An image printing apparatus comprising:

an image carrier;

a charger charging the image carrier;

the light-emitting device according to claim 1, which forms a latent image by irradiating light on a surface of the image carrier, which is charged, by the light-emitting elements;

a developer forming a visual image on the image carrier by attaching toner to the latent image; and a transcriber transferring the visual image on the image carrier to an object.

4. A light-emitting device comprising:

a plurality of light-emitting elements;

an element substrate on which the plurality of light-emitting elements is arranged;

a plate-shaped sealing member having a lens array, in which a plurality of lenses are arranged, and sealing the plurality of light-emitting elements together with the element substrate, the sealing member and the element substrate defining sealing cavities such that the sealing member is disposed between each sealing cavity in which the light-emitting elements are disposed;

the sealing member being provided with a groove portion in each sealing cavity in which an absorbent, which absorbs at least either one of moisture and oxygen, is disposed, the groove portion communicating with each corresponding sealing cavity; and a spacer disposed between the element substrate and the plate-shaped sealing member For maintaining a distance between the light-emitting elements in the lenses, the spacer including inclined portions integrated with the sealing member, the inclined portions being formed in a tapered shape in a manner such that it becomes narrower as it becomes tardier from the sealing member.

5. An image printing apparatus comprising:

an image carrier;

a charger charging the image carrier;

the light-emitting device according to claim 4, which forms a latent image by irradiating light on a surface of the image carrier, which is charged, by the light-emitting elements;

a developer forming a visual image on the image carrier by attaching toner to the latent image; and a transcriber transferring the visual image on the image carrier to an object.

* * * * *